United States Patent [19]
Furutani et al.

[11] Patent Number: 6,091,651
[45] Date of Patent: Jul. 18, 2000

[54] SEMICONDUCTOR MEMORY DEVICE WITH IMPROVED TEST EFFICIENCY

[75] Inventors: Kiyohiro Furutani; Takeshi Hamamoto; Shigeru Kikuda, all of Hyogo, Japan

[73] Assignee: Mitsubishi Denki Kabushiki Kaisha, Tokyo, Japan

[21] Appl. No.: 09/165,502

[22] Filed: Oct. 2, 1998

[30] Foreign Application Priority Data

Apr. 14, 1998 [JP] Japan .................................. 10-102556

[51] Int. Cl.[7] ...................................................... G11C 7/00
[52] U.S. Cl. ................... 365/201; 365/202; 365/189.04; 365/230.08
[58] Field of Search ...................................... 365/201, 200, 365/202, 190, 230.04, 230.06, 189.04, 230.08

[56] References Cited

U.S. PATENT DOCUMENTS

| | | | |
|---|---|---|---|
| 4,873,669 | 10/1989 | Furutani et al. .................... | 365/189.01 |
| 5,021,998 | 6/1991 | Suzuki et al. ............................. | 365/51 |
| 5,241,501 | 8/1993 | Tanaka .................................... | 365/201 |
| 5,600,591 | 2/1997 | Takagi .................................... | 365/184 |
| 5,818,792 | 10/1998 | Sasaki et al. ....................... | 365/230.08 |

FOREIGN PATENT DOCUMENTS 1-278065  11/1989  Japan .

Primary Examiner—David Nelms
Assistant Examiner—Thong Le
Attorney, Agent, or Firm—McDermott, Will & Emery

[57] ABSTRACT

I/O lines in an I/O gate-sense amplifier portion are arranged in the order of IOA, /IOB, IOB, and /IOA. As a result, the potentials of adjacent I/O lines are necessarily different at the time of writing/reading the same data to/from a plurality of memory cells during a multi-bit test. Therefore, a short-circuit fault caused between adjacent I/O lines can be detected at the same time.

11 Claims, 16 Drawing Sheets

SEMICONDUCTOR MEMORY DEVICE WITH IMPROVED TEST EFFICIENCY

BACKGROUND OF THE INVENTION

1. Field of the Invention

The present invention relates generally to semiconductor memory devices, and more particularly, to a semiconductor memory device permitting reduction of time required for testing.

2. Description of the Background Art

As the integration density of semiconductor devices increases, increase in time required for testing to validate operation came to be a significant problem. In particular, some semiconductor memory devices have a so-called multi-bit test mode as a measure to solve the problem, according to which data is written into a plurality of memory cells at a time, and data is read out from the plurality of memory cells written with the data.

FIG. 16 is a schematic diagram of the configuration of a main part of a conventional semiconductor memory device.

Referring to FIG. 16, the conventional semiconductor memory device includes a column main decoder 642 which receives internal address signals CAD[0], /CAD[0], CAD[1], /CAD[1], CAD[2], and /CAD[2], and activates one of column selecting lines CSL0 to CSL7, and row main decoders 650 and 652 which receive internal address signals RAD[0] to RAD[3], /RAD[0] to /RAD[3] generated in response to externally applied row address signals RA0 to RA3, and activates one of 16 word lines WL0 to WL15.

The conventional semiconductor memory device further includes a memory cell array 644 having memory cells arranged in a matrix and activated by word lines WL0 to WL7, and a memory cell array 648 having memory cells arranged in a matrix and activated by word lines WL8 to WL15.

The conventional semiconductor memory device further includes an I/O gate-sense amplifier portion 646 for amplifying data in corresponding memory cells in the memory array in response to activation of word lines WL0 to WL15, and connecting corresponding bit lines to I/O lines IOA, /IOA, IOB, and /IOB in response to activation of column selecting lines CSL0 to CSL7, a differential amplifier 680 having its plus and minus input nodes connected to I/O lines IOA and /IOA, respectively, a differential amplifier 678 having its plus and minus input nodes connected to I/O lines IOB and /IOB, respectively and an EXNOR circuit 682 which receives the outputs of differential amplifiers 678 and 680.

The conventional semiconductor memory device further includes I/O line isolation gates 668 and 666 activated by internal address signal CAD[3] to electrically connect I/O lines IOA and /IOA and I/O lines IO and /IO, respectively, I/O line isolation gates 664 and 662 activated by internal address signal /CAD[3] to electrically connect I/O lines IOB and /IOB and I/O lines IO and /IO, respectively, a differential amplifier 670 having its plus and minus input nodes connected to I/O lines IO and /IO, respectively, a buffer 676 for outputting a data output signal to an output terminal Dout, an output line isolation gate 684 activated by a test mode signal TE to electrically connect the output node of EXNOR circuit 682 and the input node of buffer 676, an inverter 674 for inverting received test mode signal TE, and an output line isolation gate 672 activated by the output signal of inverter 674 to electrically connect the output node of differential amplifier 670 and the input node of buffer 676.

The conventional semiconductor memory device further includes an inverter 654 which receives and inverts a signal externally applied to an input terminal Din, an inverter 656 which receives and inverts a writing control signal WDE generated in response to an externally applied writing signal, a clocked inverter 658 activated by writing control signal WDE to invert a signal applied to input terminal Din, and output the resulting signal to I/O line /IO, and a clocked inverter 660 activated by writing control signal WDE to invert the output signal of inverter 654 and output the resulting signal to I/O line 10.

The semiconductor memory device selects one of 256 memory cells by signals of 8 bits in total, i.e., address signals RA0 to RA3, and CA0 to CA3, writes data input from input terminal Din to a memory cell in a writing cycle, and outputs data held in a selected memory cell to output terminal Dout in a reading cycle.

In a normal operation mode, 256 cycles are necessary for each of writing and reading, in order to test the operation of the semiconductor memory device.

The semiconductor memory device has a test mode which halves time required for testing, by performing writing/reading on a two-memory-cell basis, in order to increase the operation test speed.

Referring to FIG. 16, in the test mode, test mode signal TE is at an H (High) level, internal address signals CAD3 and /CAD3 are both activated regardless of an input address.

As a result, in a writing cycle in the test mode, data input from input terminal Din is transmitted to I/O lines IOA, /IOA, IOB, and /IOB through I/O line isolation gates 662, 664, 666 and 668.

One of column selecting lines CSL0 to CSL7 is activated by column main decoder 642 in response to internal address signals CAD[0] to CAD[2], and /CAD[0] to /CAD[2] generated based on column addresses CA0 to CA2.

Data on an I/O line is transmitted to two bit line pairs through an I/O gate selected in IO gate-sense amplifier 646 by the activated column selecting line, and the same data is written into two memory cells selected by row main decoder 650 or 652 by internal address signals RAD[0] to RAD[3], and /RAD[0] to /RAD[3] generated based on a row address.

In a reading cycle in the test mode, data in two memory cells written with the same data in a writing cycle in the test mode is read out by selecting word lines WL0 to WL15, column selecting lines CSL0 to CSL7, similarly to the case of writing, but in the opposite path from I/O lines IOA, /IOA, IOB to /IOB.

Two pieces of data read out on I/O lines IOA, /IOA, IOB and /IOB are amplified by differential amplifiers 680 and 678. If the semiconductor memory device is operating normally, the outputs of differential amplifiers 680 and 678 provided by amplifying data read out from the memory cells written with the same data are in coincidence, and the output of EXNOR circuit 682 attains an H (high) level. The output of EXNOR circuit 682 is selected by test mode signal TE and connected to the input node of output buffer 674, and therefore an H level is output to output terminal Dout.

If the semiconductor memory device is not operating normally, and different data is output to differential amplifiers 680 and 678, an L (low) level is output to output terminal Dout.

As a result, in the test mode, an operation test may be performed on a 2-bit basis, and time required for testing may be halved.

FIG. 17 is a circuit diagram of a conventional semiconductor memory device disclosed by U.S. Pat. No. 5,021,998.

The circuit diagram shows in further detail memory cell arrays 644 and 648, and I/O gate-sense amplifier 646 shown in FIG. 16.

Referring to FIG. 17, a memory cell array 644 includes a capacitor 724 which stores data at a storage node serving as one electrode and has the other electrode connected to a cell plate CP, an access transistor 722 activated by word line WL0 to electrically connect the storage node of capacitor 724 and bit line BLL0, a capacitor 726 which stores data at a storage node serving as one electrode and has the other electrode connected to a cell plate CP, and an access transistor 728 activated by word line WLn-1 to electrically connect the storage node of capacitor 726 and bit line /BLL0.

Memory cell array 644 further includes a capacitor 764 which stores data at a storage node serving as one electrode and has the other electrode connected to a cell plate CP, an access transistor 762 activated by word line WL0 to electrically connect the storage node of capacitor 764 and bit line BLL1, a capacitor 766 which stores data at a storage node serving as one electrode and has the other electrode connected to a cell plate CP, and an access transistor 768 activated by word line WLn-1 to electrically connect the storage node of capacitor 766 and bit line /BLL1.

Although not shown, word lines WL1 to WLn-2 are similarly connected to capacitors and access transistors.

Memory cell array 648 includes a capacitor 754 which stores data at a storage node serving as one electrode and has the other electrode connected to a cell plate CP, an access transistor 752 activated by word line WLn to electrically connect the storage node of capacitor 754 and bit line BLR0, a capacitor 756 which stores data at a storage node serving as one electrode and has the other electrode connected to a cell plate CP, and an access transistor 758 activated by word line WL2n-1 to electrically connect the storage node of capacitor 756 and bit line /BLR0.

Memory cell array 648 further includes a capacitor 794 which stores data at a storage node serving as one electrode and has the other electrode connected to a cell plate CP, an access transistor 792 activated by word line WLn to electrically connect the storage node of capacitor 794 and bit line /BLR1, a capacitor 796 which stores data at a storage node serving as one electrode and has the other electrode connected to a cell plate CP, and an access transistor 798 activated by word line WL2n-1 to electrically connect the storage node of capacitor 796 and bit line /BLR1.

Although not shown, word lines WLn+1 to WL2n-1 are similarly connected to capacitors and access transistors.

I/O gate-sense amplifier 646 includes a bit line isolation gate 730 activated by bit line isolation control signal BLIL to connect bit lines BLL0 and BL0, a bit line isolation gate 732 activated by bit line isolation control signal BLIL to connect bit lines /BLL0 and /BL0, a bit line isolation gate 742 activated by a bit line isolation control signal BLIR to connect bit lines BLR0 and BL0, a bit line isolation gate 744 activated by bit line isolation control signal BLIR to connect bit lines /BLR0 and /BL0, and a sense amplifier 734 activated in a prescribed timing to amplify the potential difference between bit lines BL0 and /BL0.

Hereinafter, I/O lines provided corresponding to bit lines BL0, /BL0, BL1 and /BL1 are called I/O lines IOA, /IOA, IOB, and /IOB, respectively.

I/O gate-sense amplifier 646 further includes an I/O line isolation gate 736 activated by column selecting line CSL0 to connect bit lines BL0 and I/O line IOA, an I/O line isolation gate 738 activated by column selecting line CSL0 to connect bit line BL0 to connect bit lines /BL0 and /IOA, and an equalizer 740 activated in a prescribed timing to connect bit lines BL0 and /BL0 to attain a prescribed potential.

I/O gate-sense amplifier 646 further includes a bit line isolation gate 770 activated by bit line isolation control signal BLIL to connect bit lines BLL1 and BL1, a bit line isolation gate 772 activated by bit line isolation control signal BLIL to connect bit lines /BLL1 and /BL1, a bit line isolation gate 782 activated by bit line isolation control signal BLIR to connect bit lines BLR1 and BL1, a bit line isolation gate 784 activated by bit line isolation control signal BLIR to connect bit lines /BLR1 and /BL1, a sense amplifier 774 activated in a prescribed timing to amplify the potential difference between bit lines BL1 and /BL1, an I/O isolation gate 776 activated by column selecting line CSL0 to connect bit line BLR1 and I/O line IOB, an I/O line isolation gate 778 activated by column selecting line CSL0 to connect bit line BLR1 and I/O line /IOB, and an equalizer 780 activated in a prescribed timing to connect bit lines BL1 and BLL1 to attain a prescribed potential.

FIG. 17 shows the portion corresponding to column selecting line CSL0 in detail, and portions corresponding to column selecting lines CSL1 to CSL7 have the same configuration.

In FIG. 17, two pairs of I/O lines are placed in the central part of I/O gate-sense amplifier 646 in the order of IOA, /IOB, /IOA and IOB.

FIG. 18 is a schematic diagram of the arrangement of I/O lines and bit lines shown in FIG. 17.

Referring to FIG. 18, the connecting portion between the I/O line and the bit line is formed inside a square 811 having sides 811a, 811b, 811c, and 811d.

Corners defined by sides 811a and 811b, 811b and 811c, 811c and 811d, and 811d and 811a correspond to corner portions 811f, 811g, 811h and 811e, respectively.

Transistors 830, 840, 842 and 836 are provided at corner portions 811h, 811e, 811f, and 811g, respectively, and at the central part of each of the transistors, a gate electrode 832 is provided in parallel to side 811a. Gate electrode 832 is for example composed of tungsten silicide.

Bit line BL0 is electrically connected to a first impurity region in transistor 830 at a contact portion 846. Bit line /BL0 is electrically connected to a first impurity region in transistor 836 at a contact portion 856. Bit line BL1 is electrically connected to a first impurity region in transistor 842 at a contact portion 858. Bit line /BL1 is electrically connected to a first impurity region in transistor 840 at contact portion 866.

Between sides 811d and 811b, I/O line IOA is provided along side 811d, and I/O line IOB is provided along side 811b. Between I/O lines IOA and IOB, I/O line /IOB parallel to I/O line IOA is provided adjacent to I/O line IOA, and between I/O lines /IOB and IOB, I/O line /IOA is provided parallel to I/O line IOB. These I/O lines are, for example, formed of a first aluminum layer.

I/O line IOA is electrically connected to a second impurity region in transistor 830 at a contact portion 840. I/O line /IOB is electrically connected to a second impurity region in transistor 840 at a contact portion 868. I/O line /IOA is connected to a second impurity region in transistor 836 at a contact portion 854. I/O line IOB is electrically connected to a second impurity region in transistor 842 at a contact portion 860.

An interconnection 834 is provided parallel to side 811a at the central part of square 811, and interconnection 834 is electrically connected to gate electrode 832 at contact portion 850.

In the middle between sides 811a and 811c, column selecting line CSL is provided parallel to side 811a. Column selecting line CSL is electrically connected to interconnection 834 at contact portion 852. Interconnection 834 is for example formed of the first aluminum layer, and column selecting line CSL is for example formed of a second aluminum layer.

Herein, in FIG. 18, I/O lines /IOB and /IOA are adjacent to each other. In general, parallel interconnections provided adjacent to each other in the same interconnection layer are highly likely to cause short circuit defects because of any condition fault occurring in etching in the manufacturing process. Let us assume now that, as represented by resistor 810 in FIG. 18, there is a short circuit defect between I/O lines /IOB and /IOA.

As can be seen from FIG. 16, when H level data is input from input terminal Din, data on I/O lines IOA, /IOB, /IOA and IOB attain H, L, L and H levels, respectively, and data on I/O lines /IOB and /IOA are the same data. As a result, if there is a short circuit fault between I/O lines IOB and /IOA, the state is observed as if the device is operating normally in a multi-bit test, even if one of the I/O lines is not connected to a memory cell, and therefore a separate I/O line short circuit fault test is necessary.

SUMMARY OF THE INVENTION

It is an object of the invention to provide a semiconductor memory device that permits effective operation tests.

Stated briefly, a semiconductor memory device according to the present invention is formed on a main surface of a semiconductor substrate, and includes a first memory cell, a first bit line pair, a first input/output line pair, a second memory cell, a second bit line pair, and a second input/output line pair.

The first memory cell stores first data that takes any of first and second logical values.

The first bit line pair transmits the first data to the first memory cell. The first input/output line pair transmits the first data to the first bit line pair. The second memory cell stores second data that takes any of the first and second logical values. The second bit line pair transmits the second data to the second memory cell. The second input/output line pair transmits the second data to the second bit line pair. The first input/output line pair includes a first positive polarity input/output line which attains a first potential when the first data takes the first logical value, and attains a second potential lower than the first potential when the first data takes the second logical value, and a first negative polarity input/output line which attains a potential complementary to the first positive polarity input/output line based on the first data. The second input/output line pair includes a second positive polarity input/output line which attains a first potential when the second data takes the first logical value, and attains a second potential when the second data takes the second logical value, and a second negative polarity input/output line which attains a potential complementary to the positive polarity input/output line based on the second data, and one of the first and second positive polarity input/output lines is at least partly provided adjacent to both the first and second negative polarity input/output lines.

A main effect of the present invention therefore resides in that short-circuit faults in adjacent I/O lines may be discovered during testing the operation of writing/reading the same data to/from a plurality of memory cells, in other words effective tests may be performed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
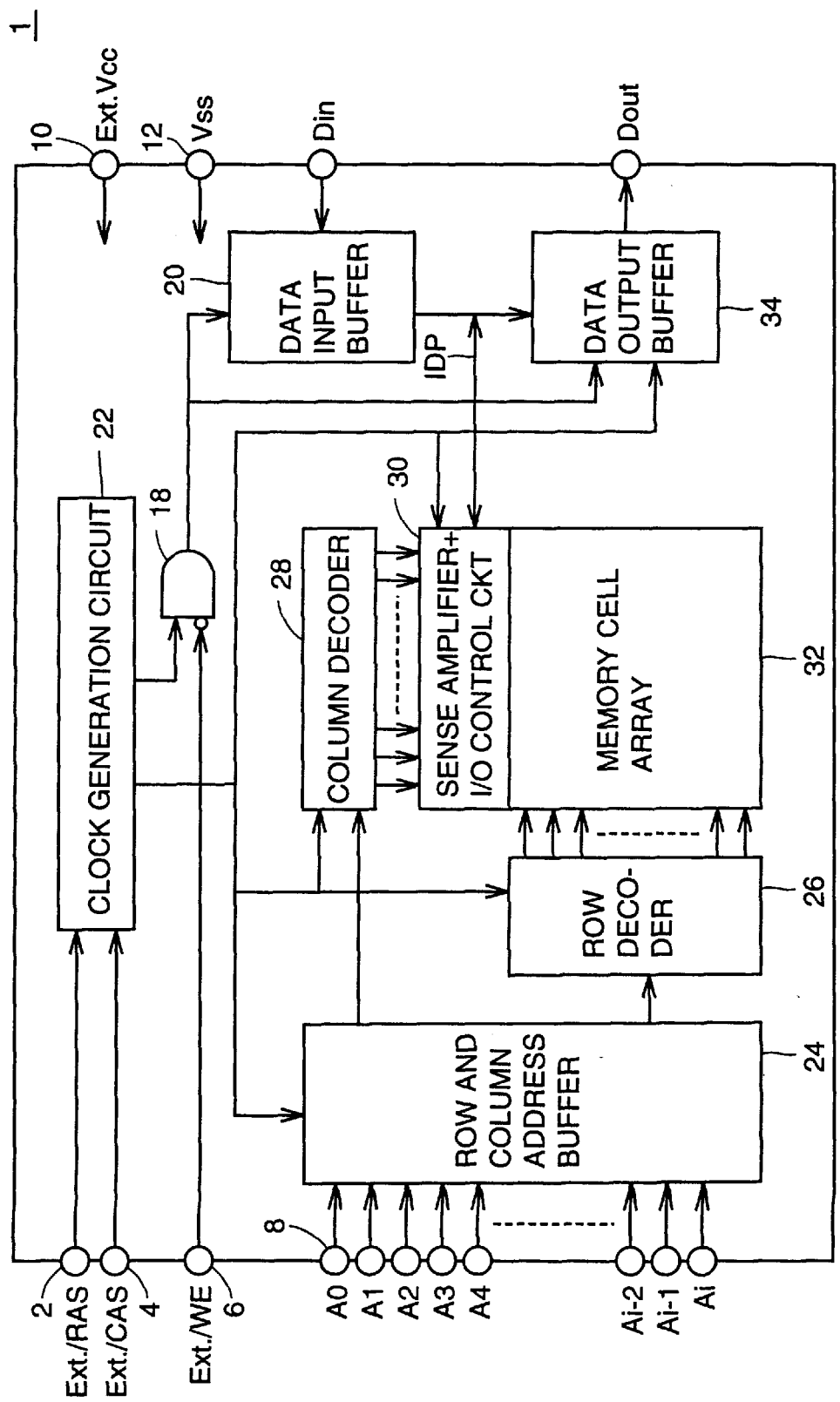
FIG. 1 is a schematic block diagram of the configuration of a semiconductor memory device 1 according to a first embodiment of the invention.

Embodiments of the present invention will be now described in detail in conjunction with the accompanying drawings, in which the same reference characters represent the same or corresponding portions.

First Embodiment

FIG. 1 is a schematic block diagram of the configuration of a semiconductor memory device 1 according to a first embodiment of the invention.

Referring to FIG. 1, semiconductor memory device 1 includes control signal input terminals 2 to 6, an address input terminal group 8, an input terminal Din to input a data signal, an output terminal Dout to output a data signal, a ground terminal 12, and a power supply terminal 10.

Semiconductor memory device 1 further includes a clock generation circuit 22, a row/column address buffer 24, a row decoder 26, a column decoder 28, a sense amplifier+input/output control circuit 30, a memory cell array 32, a gate circuit 18, a data input buffer 20 and a data output buffer 34.

Clock generation circuit 22 generates a control clock corresponding to a prescribed operation mode based on an external row address strobe signal Ext./RAS and an external column stress strobe signal Ext./CAS applied through control signal input terminals 2 and 4, respectively, and controls the operation of the entire semiconductor memory device.

Row/column address buffer 24 applies an address signal generated based on externally applied address signals A0 to Ai (i: natural number) to row decoder 26 and column decoder 28.

A memory cell in memory cell array 32 specified by row decoder 26 and column decoder 28 exchange data with the outside by input terminal Din or output terminal Dout through sense amplifier+input/output control circuit 30, data input buffer 20 or data output buffer 22.

Figure 2:
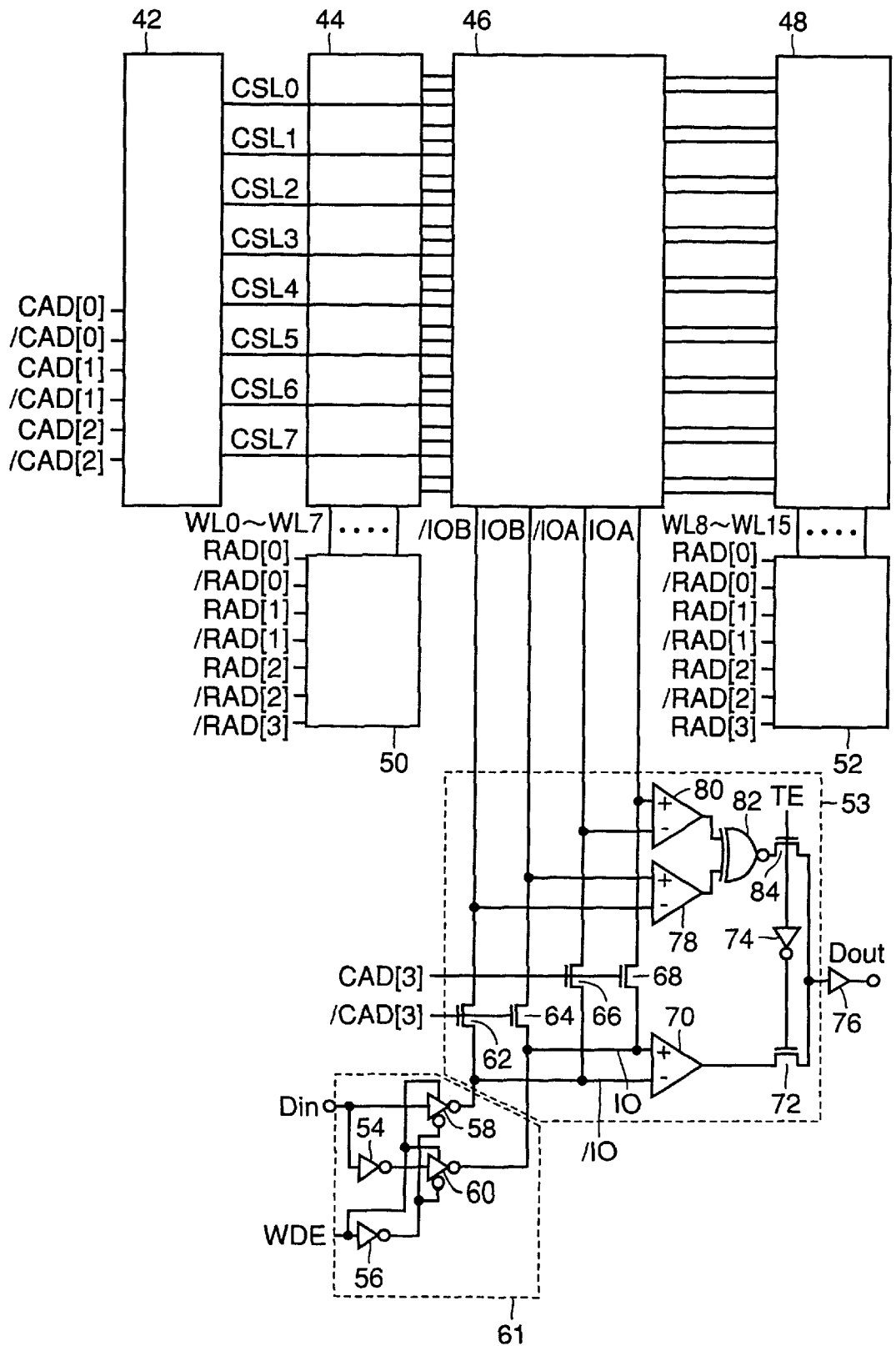
FIG. 2 is a schematic block diagram of the configuration of a main part in semiconductor memory device 1.

FIG. 2 is a schematic block diagram of the configuration of a main part of semiconductor memory device 1.

The bit width of data is 1 bit, and the address widths of row and column addresses are both 4 bits for ease of illustration, but the bit width of data and the bit width of address may be increased/reduced as desired.

Referring to FIG. 2, semiconductor memory device 1 includes a column main decoder 42 which activates one of column selecting lines CSL0 to CSL7 in response to internal address signals CAD[0] to CAD[2], and /CAD[O] to /CAD [2] generated based on externally applied column address signals CA0 to CA2, and row main decoders 50 and 52 which activates one of 16 word lines WL0 to WL15 in response to internal address signals RAD[0] to RAD[3], and /RAD[0] to /RAD[3] generated based on externally applied row address signals RA0 to RA3.

Semiconductor memory device 1 further includes a memory cell array 44 including memory cells arranged in a matrix and activated by word lines WL0 to WL7, and a memory cell array 48 including memory cells arranged in a matrix and activated by word lines WL8 to WL15.

Semiconductor memory device 1 further includes an I/O gate-sense amplifier portion 46 which amplifies data in a memory cell in a memory cell array corresponding to any of activated word lines WL0 to WL15, and outputs data in a memory cell selected based on activation of any of column selecting lines CSL0 to CSL7 to I/O lines IOA, /IOA, IOB, and /IOB, a data output buffer 76 which outputs a data output signal to output terminal Dout, a data buffer 61 which receives data externally applied to input terminal Din, and a test control portion 53 which controls data exchange between I/O lines IOA, /IOA, IOB, /IOB and data input buffer 61 or data output buffer 76.

Test control portion 53 includes a differential amplifier 80 having its plus and minus input nodes connected to I/O lines IOA and /IOA, respectively, a differential amplifier 78 having its plus and minus input nodes connected to I/O lines IOB and /IOB, respectively, an EXNOR circuit 82 which receives the outputs of differential amplifiers 78 and 80, I/O line isolation gates 68 and 66 activated by internal address signal CAD[3] to electrically connect I/O lines IOA and /IOA to I/O lines IO and /IO, I/O line isolation gates 64 and 62 activated by internal address signal /CAD[3] to electrically connect I/O lines IOB and /IOB to I/O lines IO and /IO, respectively, a differential amplifier 70 having its plus and minus input nodes connected to I/O lines IO and /IO, respectively, an output line isolation gate 84 activated by test mode signal TE to electrically connect the output of EXNOR circuit 82 to the input node of output buffer 76, an inverter 74 which inverts received test mode signal TE, and an output line isolation gate 72 activated by the output signal of inverter 74 to electrically connect the output of differential amplifier 70 and the input node of output buffer 76.

Data input buffer 61 includes an inverter 54 which receives and inverts a signal externally applied to input terminal Din, an inverter 56 which receives and inverts a writing control signal WDE generated based on an externally applied writing signal, a clocked inverter 58 activated by writing control signal WDE to inverts a signal applied to input terminal Din and outputs the result to I/O line /IO, and a clocked inverter 60 activated by writing control signal WDE to output the result to I/O line IO.

Figure 3:
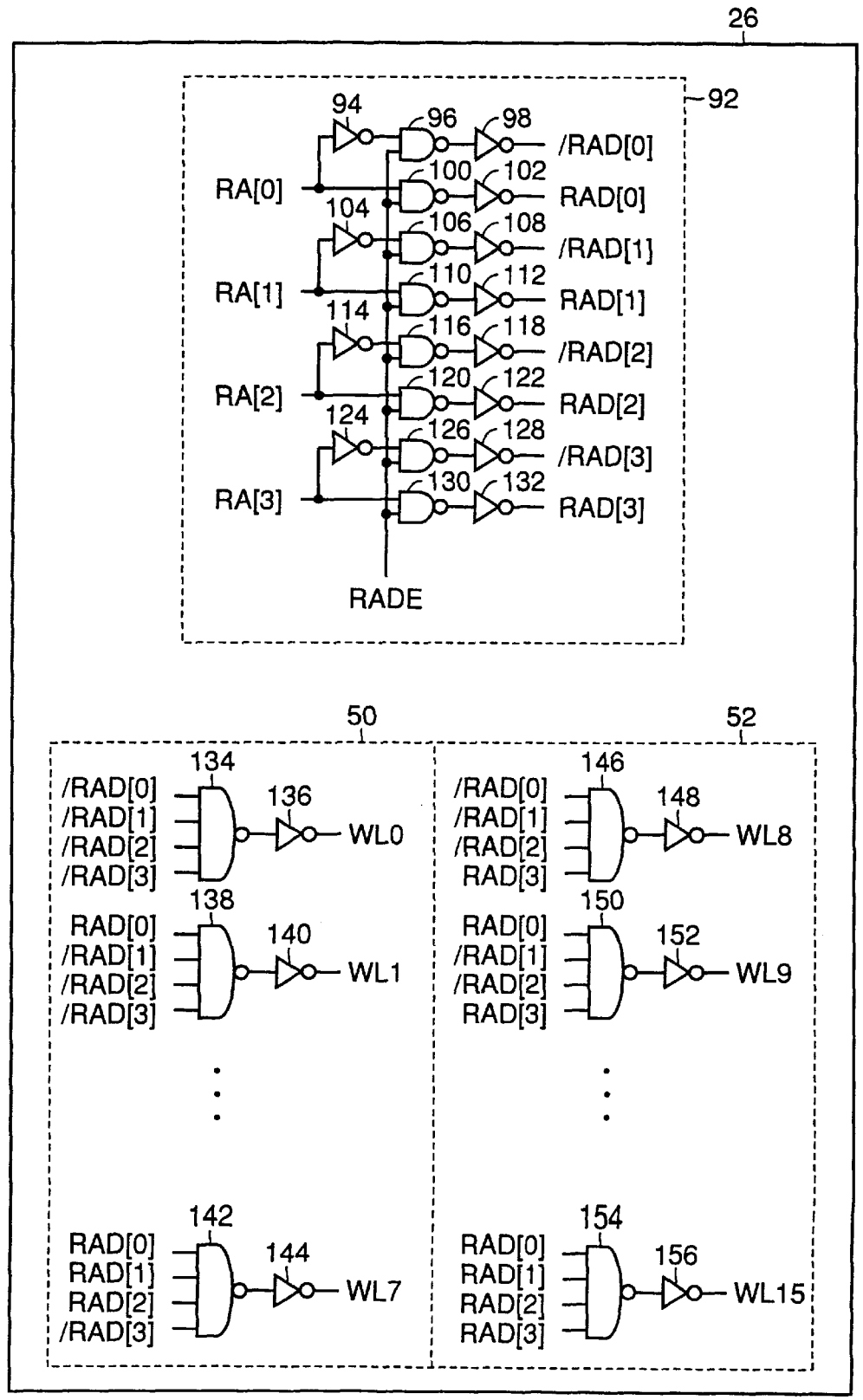
FIG. 3 is a circuit diagram showing in detail row decoder 26 shown in FIG. 1.
Figure 11:
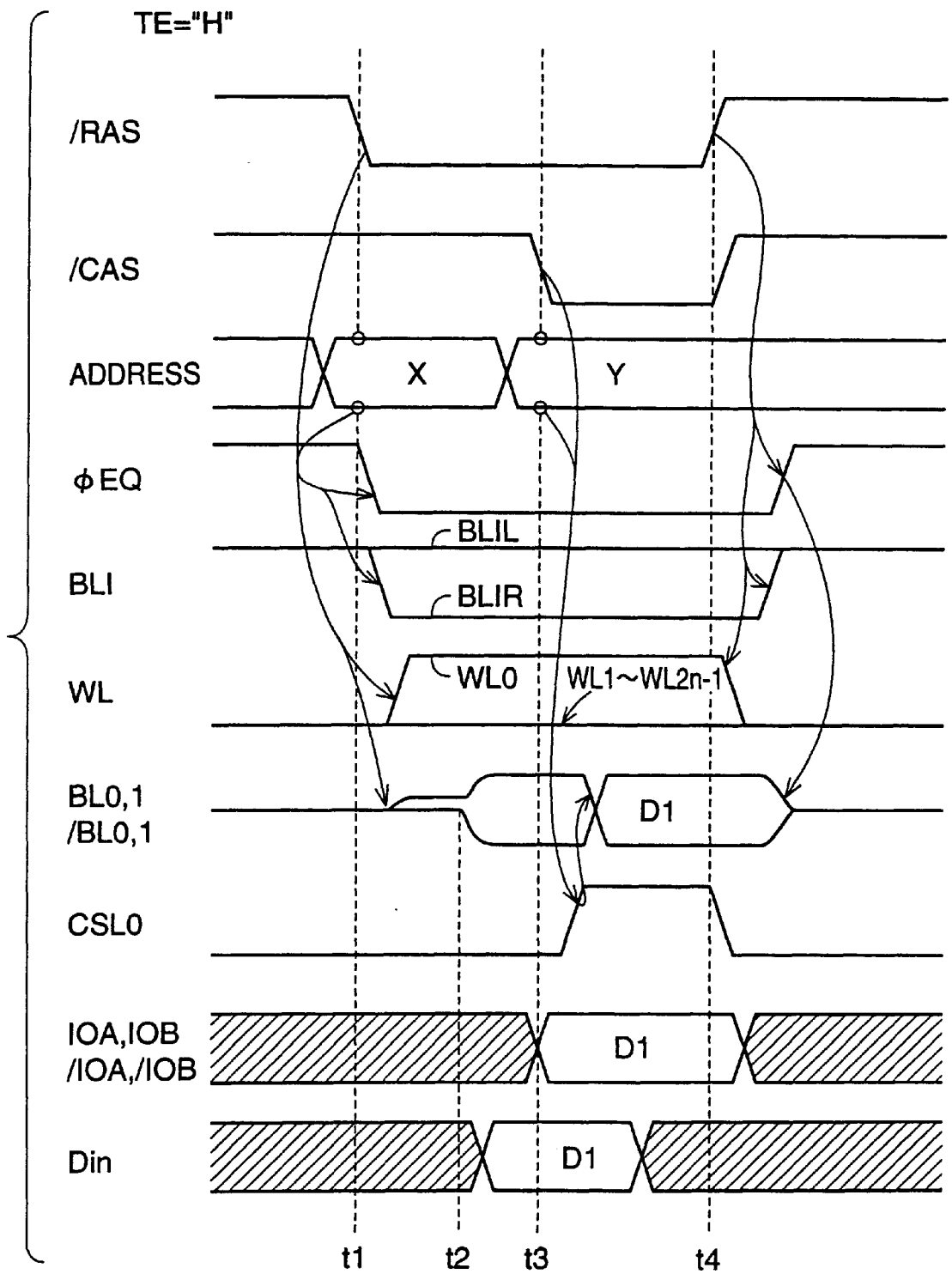
FIG. 11 is an operation waveform chart for use in illustration of the operation during writing in the test mode.

FIG. 3 is a circuit diagram showing in detail row decoder 26 shown in FIG. 11.

Referring to FIG. 3, row decoder 26 includes a row predecoder 92, and row main decoders 50 and 52.

Row predecoder 92 includes inverters 94, 104, 114, and 124 which receive and invert row addresses RA[0], RA[1], RA[2], and RA[3], respectively applied from row/column address buffer 24 shown in FIG. 1, an NAND circuit 96 which receives the output of inverter 94 and an enable signal RADE, an inverter 98 which receives and inverts the output of NAND circuit 96 to output an internal address signal /RAD[0], an NAND circuit 100 which receives an address signal RA[0] and enable signal RADE, an inverter 102 which receives and inverts the output of NAND circuit 100 to output an internal address signal RAD[0], an NAND circuit 106 which receives the output of inverter 104 and enable signal RADE, an inverter 108 which receives and inverts the output of NAND circuit 106 to output an internal address signal /RAD[1], an NAND circuit 110 which receives address signal RA[1] and enable signal RADE, and an inverter 112 which receives and inverts the output of NAND circuit 110 to output internal address signal RAD[1].

Row predecoder 92 further includes an NAND circuit 116 which receives the output of inverter 114 and enable signal RADE, an inverter 118 which receives and inverts the output of NAND circuit 116 to output internal address signal /RAD[2], an NAND circuit 120 which receives address signal RA[2] and enable signal RADE, an inverter 122 which receives and inverts the output of NAND circuit 120 to output internal address signal RAD[2], an NAND circuit 126 which receives the output of inverter 124 and enable signal RADE, an inverter 128 which receives and inverts the output of NAND circuit 126 to output internal address signal /RAD[3], an NAND circuit 130 which receives address signal RA[3] and enable signal RADE, and an inverter 132 which receives and inverts the output of NAND circuit 130 to output internal address signal RAD[3].

Row main decoder 50 includes a 4-NAND circuit 134 which receives internal address signals /RAD[0], /RAD[1], /RAD[2], and /RAD[3], an inverter 136 which receives and inverts the output of 4-NAND circuit 134 to output the result on word line WL0, a 4-NAND circuit138 which receives internal address signals RAD[0], /RAD[1], /RAD[2], and /RAD[3], an inverter 140 which receives and inverts the output of 4-NAND circuit 138 to output the result on word line WL1, a 4-NAND circuit 142 which receives internal address signals RAD[0], RAD[1], RAD[2], and /RAD[3], and an inverter 144 which receives and inverts the output of 4-NAND circuit 142 to output the result on word line WL7.

Row main decoder 50 further includes 4-NAND circuits which receive internal addresses corresponding to word lines WL2 to WL6, though not shown, and inverters which invert the outputs of 4-NAND circuits to output the result on the word lines.

Row main decoder 52 includes a 4-NAND circuit 146 which receives internal address signals /RAD[0], /RAD[1], /RAD[2], and RAD[3], and an inverter 148 which receives and inverts the output of 4-NAND circuit 146 to output the result on word line WL8, a 4-NAND circuit 150 which receive internal address signals RAD[0], /RAD[1], /RAD[2], and RAD[3], an inverter 152 which receives and inverts the output of 4-NAND circuit 150 and outputs the result on word line WL9, a 4-NAND circuit 154 which receives internal address signals RAD[0], RAD[1], RAD[2], and RAD[3], and an inverter 156 which receives and inverts the output of 4-NAND circuit 154 to output the result on word line WL15.

Row main decoder 52 further includes 4-NAND circuits which receive internal addresses corresponding to word lines WL10 to WL14 though not shown, and inverters which receive and invert the outputs of the 4-NAND circuits to output the result on the word lines.

Figure 4:
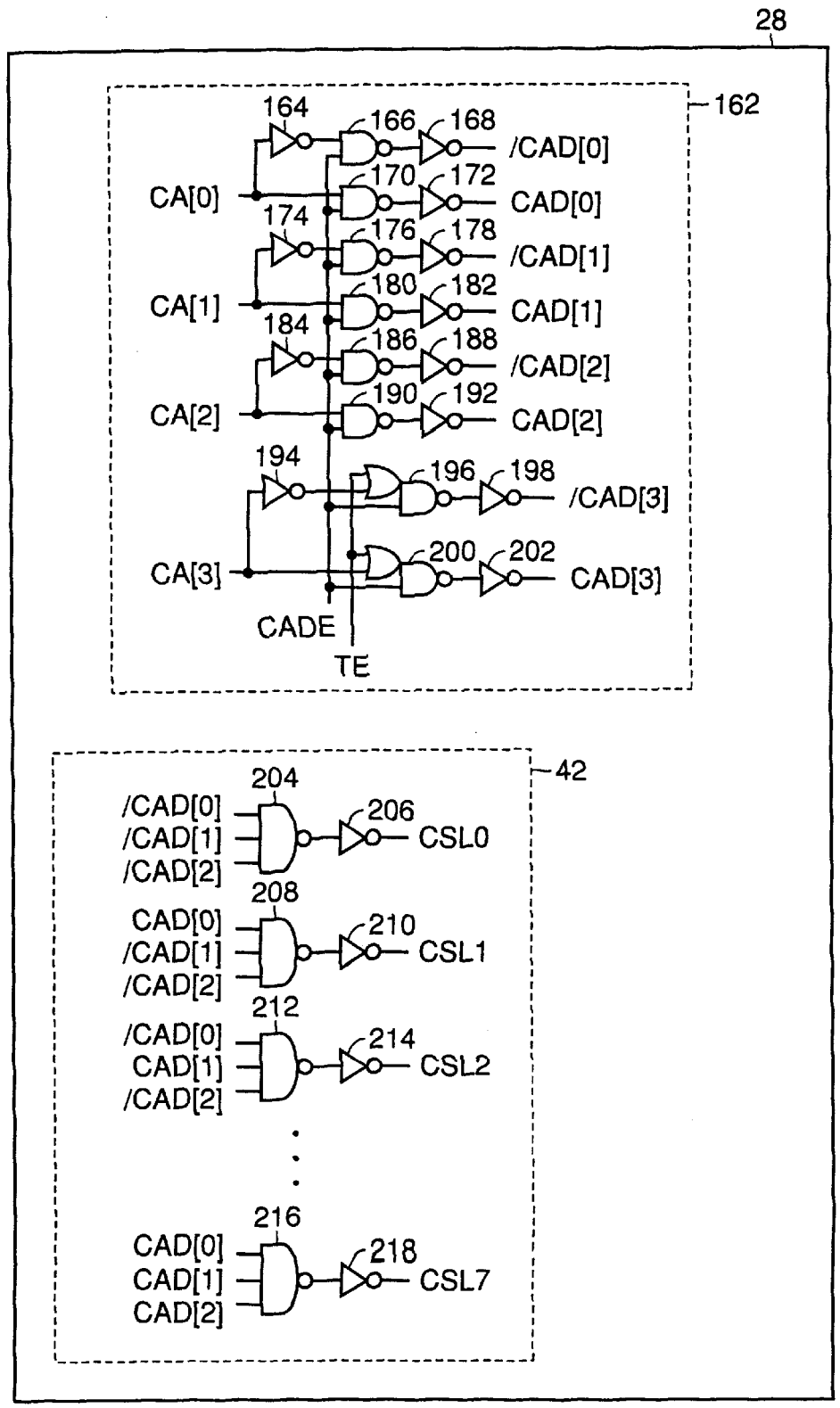
FIG. 4 is a circuit diagram showing in detail column decoder 28 shown in FIG. 1.

FIG. 4 is a circuit diagram showing in detail column decoder 28 shown in FIG. 1.

Referring to FIG. 4, column decoder 28 includes a column predecoder 162 and a column main decoder 42.

Column predecoder 162 includes inverters 164, 174, 184, and 194 which receive and invert column addresses CA[0], CA[1], CA[2], and CA[3], respectively received from row/column address buffer 24 shown in FIG. 1, an NAND circuit 166 which receives the output of inverter 164 and an enable signal CADE, an inverter 168 which receives and inverts the output of NAND circuit 166 to output internal address /CAD[0], an NAND circuit 170 which receives column address CA[0] and enable signal CADE, and an inverter 172 which receives and inverts the output of NAND circuit 170 to output internal address signal CAD[0].

Column predecoder 162 further includes an NAND circuit 176 which receives the output of inverter 174 and enable signal CADE, an inverter 178 which receives and inverts the output of NAND circuit 176 to output an internal address signal /CAD[1], an NAND circuit 180 which receives column address CA[1] and enable signal CADE, an inverter 182 which receives and inverts the output of NAND circuit 180 to output internal address signal CAD[1], an NAND circuit 186 which receives the output of inverter 184 and enable signal CADE, an inverter 188 which receives and inverts the output of NAND circuit 186 to output an internal address signal /CAD[2], an NAND circuit 190 which receives column address CA[2] and enable signal CADE, and an inverter 192 which receives and inverts the output of NAND circuit 190 to output an internal address CAD[2].

Column predecoder 162 further includes a composite gate 196 which takes the logical sum of test mode signal TE and the output signal of inverter 194 to output the NAND logic of the result and enable signal CADE, an inverter 198 which receives and inverts the output of composite gate 196 to output an internal address signal /CAD[3], a composite gate 200 which takes the logical sum of test mode signal TE and column address signal CA[3] to output the NAND logic of the result and enable signal CADE, and an inverter 202 which receives and inverts the output of composite gate 200 to output an internal address signal CAD[3].

Column main decoder 42 includes a 3-NAND circuit 204 which receives internal address signals /CAD[0], /CAD[1], and /CAD[2], an inverter 206 which receives the output of 3-NAND circuit 204 and outputs the inverse of the output on column selecting line CSL0, a 3-NAND circuit 208 which receives internal address signals CAD[0], /CAD[1], and /CAD[2], an inverter 210 which receives the output of 3-NAND circuit 208 and outputs the inverse of the output on column selecting line CSL1, a 3-NAND circuit 212 which receives internal address signals /CAD[0], CAD[1], and /CAD[2], an inverter 214 which receives the output of 3-NAND circuit 212 and outputs the inverse of the output on column selecting line CSL2, a 3-NAND circuit 216 which receives internal address signals CAD[0], CAD[1], and CAD[2], and an inverter 218 which receives the output of 3-NAND circuit 216 and outputs the inverse of the output on column selecting line CSL7.

Although not shown, column main decoder 42 further includes 3-NAND circuits which receive internal addresses corresponding to column selecting lines CSL3 to CSL6, and inverters which receive the outputs of the 3-NAND circuits and output the inverse of the outputs on corresponding column selecting lines.

Now, a first example of I/O line arrangement to detect short circuit faults on the I/O line in a multi-bit test which have been encountered in the conventional semiconductor memory device will be described.

Figure 5:
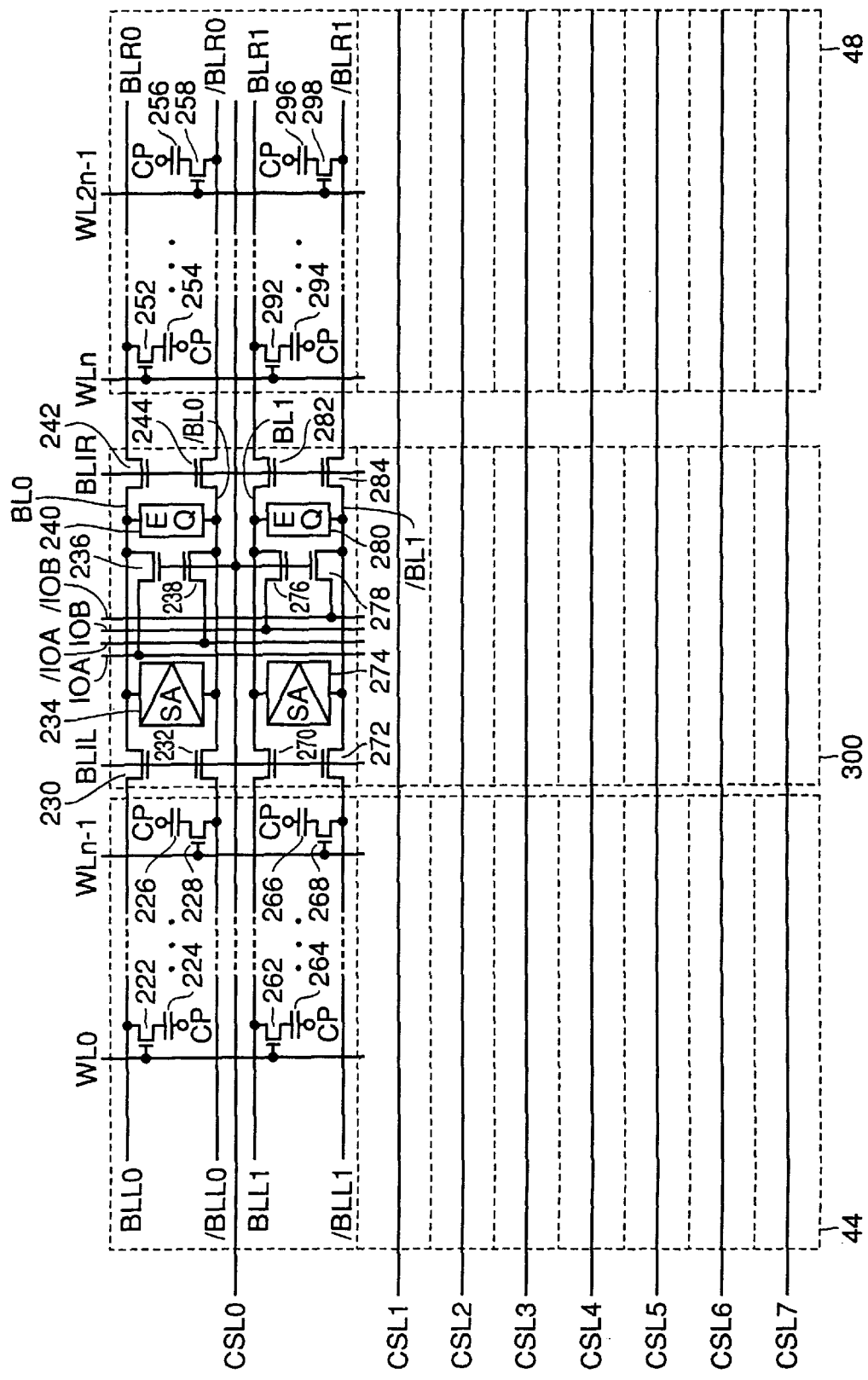
FIG. 5 is a circuit diagram for use in illustration of a first example of the arrangement of I/O lines.

FIG. 5 is a circuit diagram of this first example of I/O line arrangement.

Referring to FIG. 5, memory cell array 44 includes a capacitor 224 storing data at a storage node serving as one electrode, and having the other electrode connected to a cell plate CP, and an access transistor 222 activated by a word line WL0 to electrically connect the storage node of capacitor 224 and a bit line BLL0, a capacitor 226 storing data at a storage node serving as one electrode, and having the other electrode connected to a cell plate CP, and an access transistor 228 activated by a word line WLn-1 to electrically connect the storage node of capacitor 226 and a bit line /BLL0.

Memory cell array 44 further includes a capacitor 264 storing data at a storage node serving as one electrode, and having the other electrode connected to a cell plate CP, an access transistor 262 activated by word line WL0 to electrically connect the storage node of capacitor 264 and a bit line BLL1, a capacitor 266 storing data at a storage node serving as one electrode, and having the other electrode connected to a cell plate CP, and an access transistor 268 activated by word line WLn-1 to electrically connect the storage node of capacitor 266 and a bit line /BLL1.

Although not shown, word lines WL1 to WLn-2 are each similarly connected to a capacitor and an access transistor.

Memory cell array 48 includes a capacitor 254 storing data at its storage node serving as one electrode, and having the other electrode connected to a cell plate CP, an access transistor 252 activated by word line WLn to electrically connect the storage node of capacitor 254 and a bit line BLR0, a capacitor 256 storing data at a storage node serving as one electrode, and having the other electrode connected to a cell plate CP, and an access transistor 258 activated by word line WL2n-1 to electrically connect the storage node of capacitor 256 and a bit line /BLR0.

Memory cell array 48 further includes a capacitor 294 storing data at a storage node serving as one electrode, and having the other electrode connected to cell plate CP, an access transistor 292 activated by word line WLn to electrically connect the storage node of capacitor 294 and a bit line BLR1, a capacitor 296 storing data at a storage node serving as one electrode, and having the other electrode connected to a cell plate CP, and an access transistor 298 activated by word line WL2n-1 to electrically connect the storage node of capacitor 296 and a bit line /BLR1.

Although not shown, word lines WLn+1 to WL2n-2 are each similarly connected to a capacitor and an access transistor.

I/O gate-sense amplifier 300 includes a bit line isolation gate 230 activated by a bit line isolation control signal BLIL to connect bit lines BLL0 and BL0, a bit line isolation gate 232 activated by bit line isolation control signal BLIL to connect bit lines /BLL0 and /BL0, a bit line isolation gate 242 activated by bit line isolation control signal BLIR to connect bit lines BLR0 and BL0, a bit line isolation gate 244 activated by bit line isolation control signal BLIR to connect bit lines /BLR0 and /BL0, and a sense amplifier 234 activated in a prescribed timing to amplify the potential difference between bit lines BL0 and /BL0.

Hereinafter, I/O lines provided corresponding to bit lines BL0, /BL0, BL1, and /BL1 are referred to as I/O lines IOA, /IOA, IOB, and /IOB, respectively.

I/O gate-sense amplifier 300 further includes an I/O line isolation gate 236 activated by column selecting line CSL0 to connect bit line BL0 and I/O line IOA, an I/O line isolation gate 238 activated by column selecting line CSL0 to connect bit line /BL0 and I/O line /IOA, and an equalizer 240 activated in a prescribed timing to connect bit lines BL0 and /BL0, whereby to bring the potential to a prescribed level.

I/O gate-sense amplifier 300 further includes a bit line isolation gate 270 activated by bit line isolation control signal BLIL to connect bit lines BLL1 and BL1, a bit line isolation gate 272 activated by bit line isolation control signal BLIL to connect bit lines BLL1 and /BL1, a bit line isolation gate 282 activated by bit line isolation control signal BLIR to connect bit lines BLR1 and BL1, a bit line isolation gate 284 activated by bit line isolation control signal BLIR to connect bit lines /BLR1 and /BL1, a sense amplifier 274 activated in a prescribed timing to amplify the potential difference between bit lines BL1 and /BL1, an I/O line isolation gate 276 activated by column selecting line CSL0 to connect bit line BL1 and I/O line IOB, an I/O line isolation gate 278 activated by column selecting line CSL0 to connect bit lines /BL1 and I/O line /IOB, and an equalizer 280 activated in a prescribed timing to connect bit lines BL1 and BL1, whereby to bring the potential to a prescribed level.

FIG. 5 shows in detail the portion corresponding to column selecting line CSL0, while the portions corresponding to column selecting lines CSL1 to CSL7 each have a similar configuration. In FIG. 5, I/O lines IOA, /IOA, IOB, and /IOB are arranged in this order. In this arrangement, during externally writing/reading H (high) data, H (high), L (low), H, and L data are output to I/O lines IOA, /IOA, IOB, and /IOB, respectively. As a result, a large potential difference is generated between adjacent I/O lines, and a short-circuit fault on the I/O lines if any may be detected as a fault by performing a multi-bit test in a test mode.

Layouts for implementing the arrangement shown in FIG. 5 on a semiconductor substrate will be now described.

Figure 6:
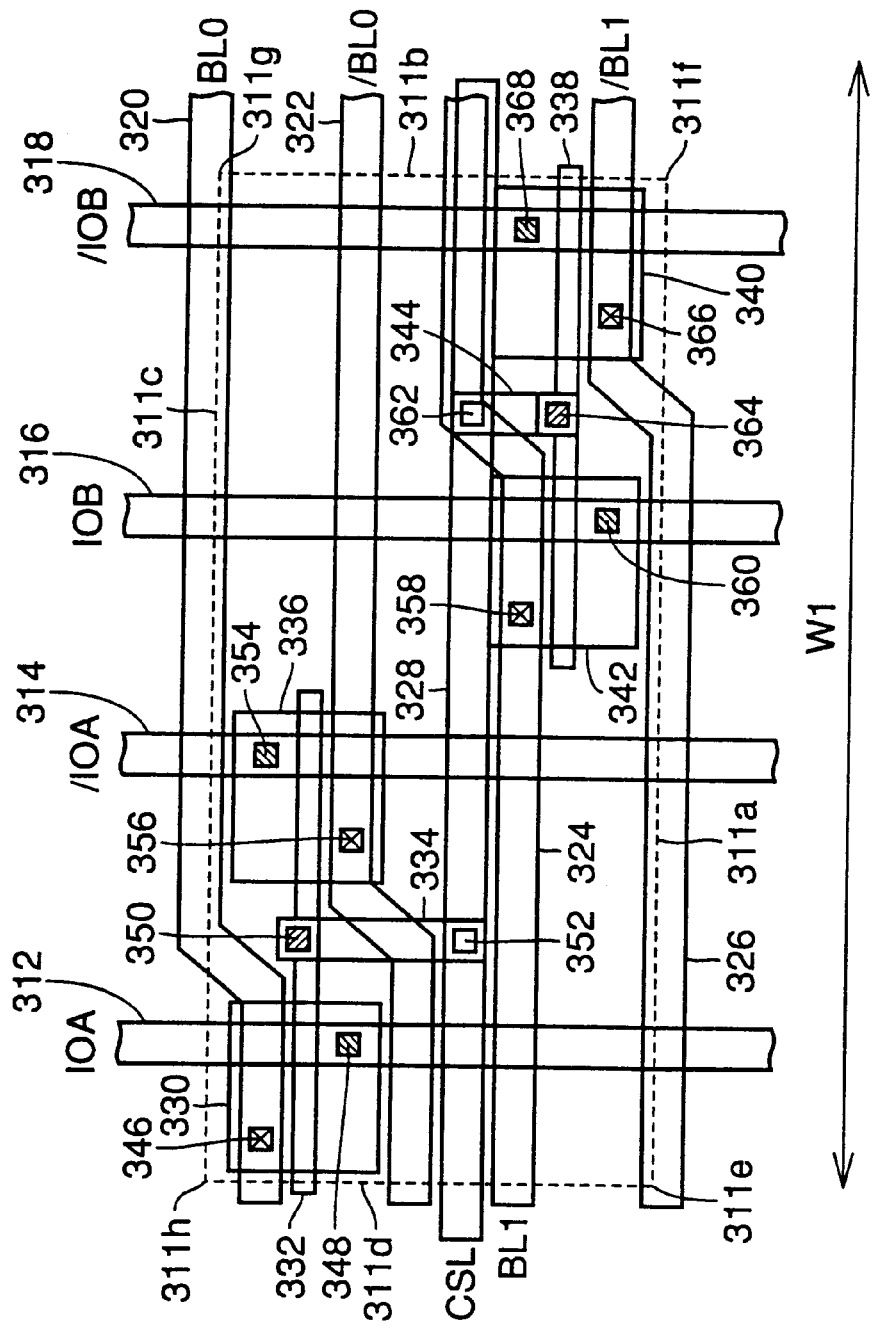
FIG. 6 is a schematic diagram for use in illustration of the arrangement of the I/O line isolation gate portion shown in FIG. 5.

FIG. 6 is a schematic diagram of the arrangement of the I/O line isolation gate portion shown in FIG. 5.

Referring to FIG. 6, the I/O line isolation gate portion is formed in a region inside a square 311 having sides 311a, 311b, 311c and 311d.

311e refers to a corner portion corresponding to the corner formed by sides 311a and 311d, 311f refers to a corner portion corresponding to the corner formed by sides 311a and 311b, 311g refers to a corner portion corresponding to the corner formed by sides 311b and 311c, and 311h refers to a corner portion corresponding to the corner formed by sides 311c and 311d.

A transistor 330 is provided at corner portion 311h inside square 311, and a transistor 336 is provided at a position adjacent to transistor 330 and along side 331c. Transistor 330 is provided with a gate electrode 332 in its center and parallel to side 311c, and transistor 336 is similarly provided with a gate electrode 332 in its central portion and parallel to side 311c.

A transistor 340 is provided at a corner portion 311f diagonal to corner portion 311h in square 311, and a transistor 342 is provided at a position adjacent to transistor 340 and along side 311a. Transistor 340 is provided with a gate electrode 338 in parallel to side 311a in its center, and a gate electrode 338 is similarly provided in parallel to side 311a in the center of transistor 342. Gate electrodes 332 and 338 are for example composed of tungsten silicide.

In the I/O line isolation gate portion, bit line BL0 is further provided to generally along side 311c, and a bit line BL1 is provided almost along side 311a. Bit line /BL0 is provided at a position adjacent to bit line BL0 and between bit lines BL0 and /BL1, and bit line BL1 is provided between bit lines /BL0 and /BL1. These bit lines are formed of tungsten silicide.

I/O line IOA is provided in parallel to side 311d between sides 311d and 311b and I/O line /IOB is provided along side 311b. I/O line /IOA is provided in parallel to I/O line IOA between I/O lines IOA and IOB, and I/O line IOB is provided between I/O lines /IOA and /IOB. These I/O lines are for example formed of a first aluminum layer.

Bit line BL0 is electrically connected to a first impurity region in transistor 330 through a contact portion 346. Bit line /BL0 is electrically connected to a first impurity region in transistor 336 through a contact portion 356. Bit line BL1 is electrically connected to a first impurity region in transistor 342 through a contact portion 358. Bit line /BL1 is electrically connected to a first impurity region in transistor 340 through a contact portion 366.

I/O line IOA is electrically connected to a second impurity region in transistor 330 through a contact portion 348. I/O line /IOA is connected to a second impurity region in transistor 336 through a contact portion 354. I/O line IOB is electrically connected to a second impurity region in transistor 342 through a contact portion 360. I/O line /IOB is electrically connected to a second impurity region in transistor 340 through a contact portion 368.

An interconnection 334 is formed parallel to side 311d between transistors 330 and 336, and an interconnection 344 is formed parallel to side 311d between transistors 342 and 340. Interconnections 334 and 344 are for example formed of a first aluminum layer. Column selecting line CSL is formed parallel to side 311a in the middle between sides 311c and 311a. Column selecting line CSL is for example formed of a second aluminum layer. Gate electrode 332 and interconnection 334 are electrically connected through a contact portion 350, and interconnection 334 and column selecting line CSL are electrically connected through contact portion 352. Gate electrode 338 and interconnection 344 are electrically connected through a contact portion 364, and interconnection 344 and column selecting line CSL are electrically connected through a contact portion 362.

If I/O lines IOA, /IOA, IOB, and /IOB are arranged in this order as shown in FIG. 6, width W1 is larger than the case of the conventional semiconductor memory device.

The reason why width W1 increases by arranging I/O lines IOA, /IOA, IOB, and /IOB in this order will be briefly described.

Figure 7:
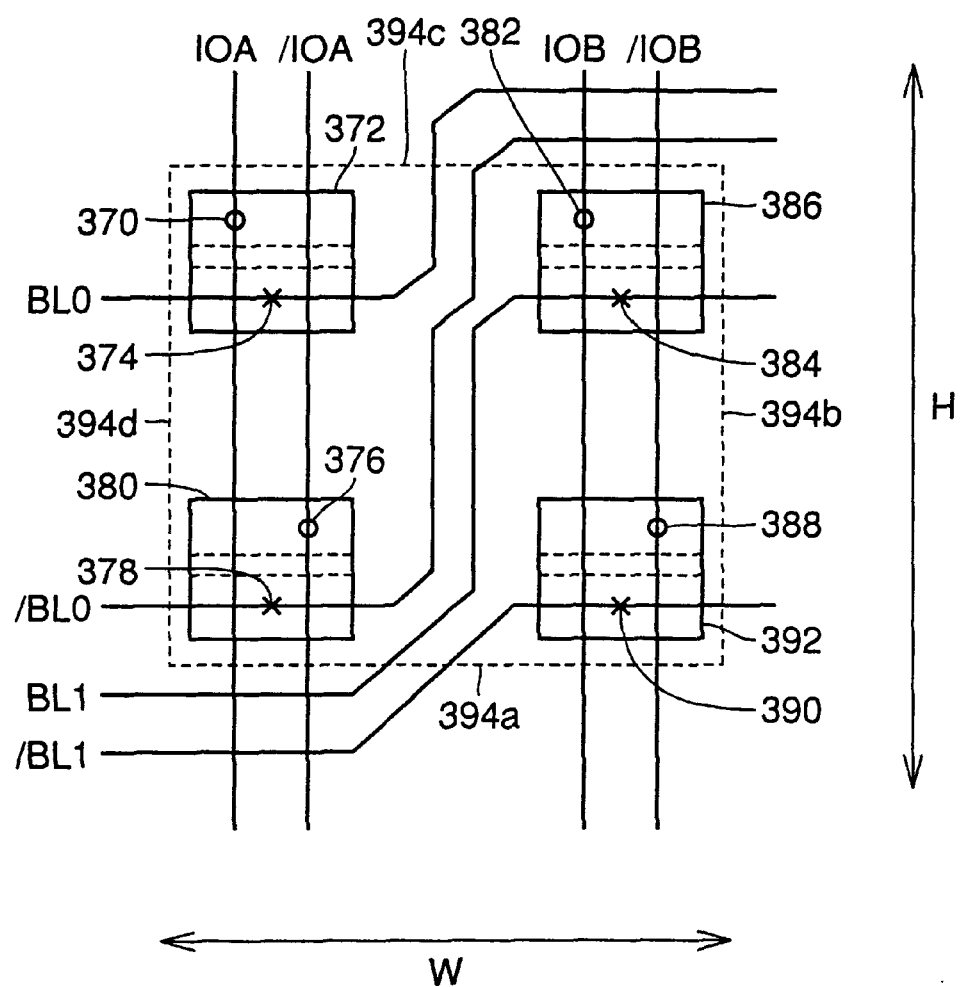
FIG. 7 is a schematic diagram for use in illustration of the arrangement of connection portions between bit lines and I/O lines.

FIG. 7 is a schematic diagram showing how connection portions between bit lines and I/O lines are arranged.

Figure 18:
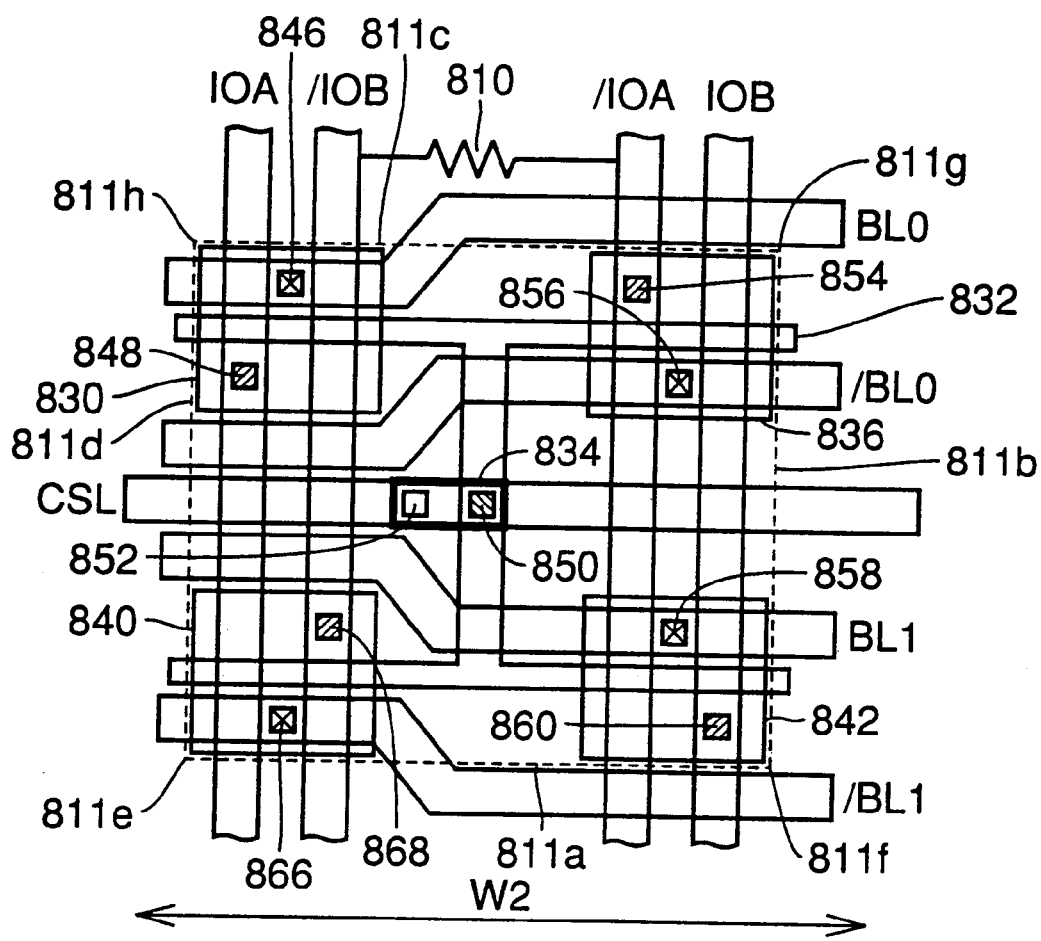
FIG. 18 is a schematic diagram showing the arrangement of a connection portions between I/O lines and bit lines shown in FIG. 17.

Referring to FIG. 7, the connection portions are formed in the region inside a square 394 formed of sides 394a, 394b, 394c, and 394d. In FIG. 7, as is the case with the conventional example described in connection with FIG. 18, transistors 372, 386, 392, and 380 are provided at the four corner portions of square 394. In this arrangement, width W may be the same as the conventional example. Each of the four transistors has a gate electrode provided in its center and parallel to side 394a.

I/O lines IOA, /IOA, IOB, and /IOB are arranged in this order toward side 394b from side 394d and parallel to side 394d between sides 394d and 394b.

I/O line IOA is electrically connected to a first impurity region in transistor 372 through a contact portion 370. I/O line /IOA is electrically connected to a first impurity region in transistor 380 through a contact portion 376. I/O line IOB is electrically connected to a first impurity region in transistor 386 through a contact portion 382. I/O line IOB is electrically connected to a first impurity region in transistor 392 through a contact portion 388.

Meanwhile, bit lines BL0, /BL0, BL1, and /BL1 are arranged in this order from the side with side 394a toward the side with side 394a.

Bit line BL0 is electrically connected to a second impurity region in transistor 372 through a contact portion 374. Bit line /BL0 is electrically connected to a second impurity region in transistor 380 through a contact portion 378. Bit line BL1 is electrically connected to a second impurity region in transistor 386 through a contact portion 384. Bit line /BL1 is electrically connected to a second impurity region in transistor 392 through a contact portion 390.

In this arrangement, width W may be restricted to the size as large as the conventional device, but height H increases instead.

This is because, in general, signal lines transmitting different signals in the same interconnection layer must be crossed through another interconnection layer if necessary, which requires contact holes, resulting in increase in the area. In order to avoid such crossing over of the bit lines, bit lines BL0 and /BL0 should go greatly around transistor 386, which increases height H accordingly, while bit lines BL1 and /BL1 should similarly go around transistor 380, which increases height H accordingly.

Herein, considering that the connection portion between a bit line and an I/O line is connected to the memory cell array, difficulty is involved in positioning a bit line pair greatly away from a transistor, because a bit line pair has its pitch determined by a memory cell. As a result, the entire area may be reduced by increasing the width as shown in FIG. 6 rather than by increasing the height as shown in FIG. 7.

In the arrangement shown in FIG. 6, however, the chip area could be disadvantageously increased in order to detect a short circuit fault during a multi-bit test. The way of further reducing the area in association with the order of arranging I/O lines will be now described.

As described above, changing the position of bit lines or crossing them over greatly affects the entire device, because the bit lines are related to the arrangement of memory cells, and hereinafter only the way of changing the order of arranging I/O lines will be considered.

Figure 8:
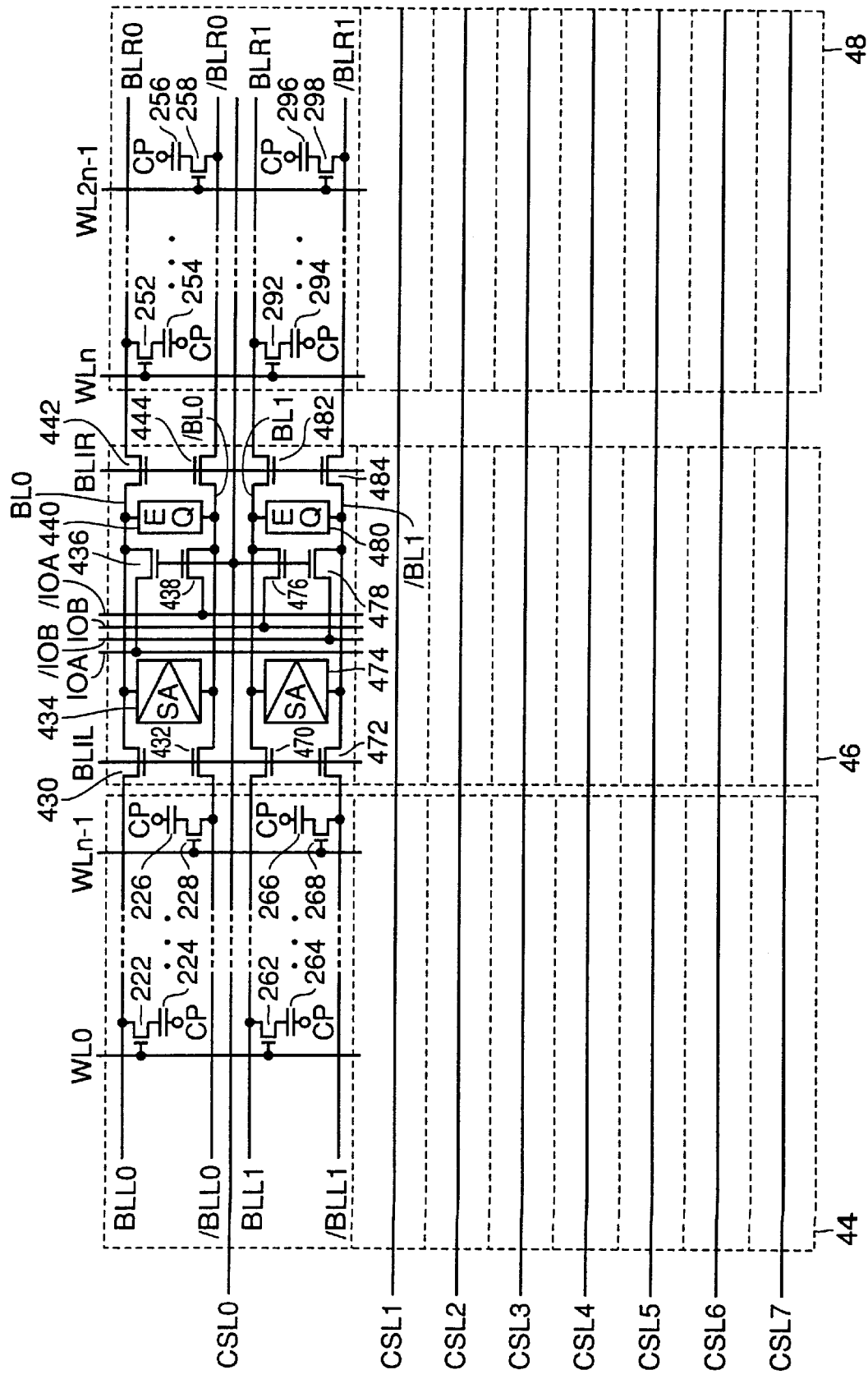
FIG. 8 is a circuit diagram showing in detail a memory cell array and a sense amplifier-I/O isolation gate portion in the semiconductor memory device according to the first embodiment.

FIG. 8 is a circuit diagram showing in detail a memory cell array and an I/O gate-sense amplifier portion in the semiconductor memory device according to the first embodiment of the invention.

Referring to FIG. 8, I/O gate-sense amplifier portion 46 includes a bit line isolation gate 430 which electrically connects bit lines BLL0 and BL0 in response to an activation of bit line isolation control signal BLIL, a bit line isolation gate 432 which electrically connects bit lines /BLL0 and /BL0 in response to an activation of bit line isolation control signal BLIL, a bit line isolation gate 442 which electrically connects bit lines BLR0 and BL0 in response to an activation of bit line isolation control signal BLIR, a bit line isolation gate 444 which electrically connects bit lines /BLR0 and /BL0 in response to an activation of bit line isolation control signal BLIR, an equalizer 440 activated in a prescribed timing to bring bit lines BL0 and /BL0 to the same potential level, a sense amplifier 434 activated in a prescribed timing to amplify the potential difference between bit lines BL0 and /BL0, an I/O line isolation gate 436 activated in response to the potential of column selecting line CSL0 to electrically connect bit line BL0 and I/O line IOA, and an I/O line isolation gate 438 activated in response to the potential of column selecting line CSL0 to electrically connect bit line /BL0 and I/O line /IOA.

I/O gate-sense amplifier portion 46 further includes a bit line isolation gate 470 which electrically connects bit lines BLL1 and BL1 in response to an activation of bit line isolation control signal BLIL, a bit line isolation gate 472 which electrically connects bit lines /BLL1 and /BL1 in response to an activation of bit line isolation control signal BLIL, a bit line isolation gate 482 which electrically connects bit lines BLR1 and BL1 in response to an activation of bit line isolation control signal BLIR, a bit line isolation gate 484 which electrically connects bit lines /BLR1 and /BL1 in response to an activation of bit line isolation control signal BLIR, an equalizer 480 activated in a prescribed timing to bring bit lines BL1 and /BL1 to the same potential level, a sense amplifier 474 activated in a prescribed timing to amplify the potential difference between bit lines BL1 and /BL1, an I/O line isolation gate 476 activated in response to the potential of column selecting line CSL0 to electrically connect bit lines BL1 and I/O line IOB, and an I/O line isolation gate 478 activated in response to the potential of column selecting line CSL0 to electrically connect bit lines /BL1 and I/O line/IOB.

Memory cell arrays 44 and 48 have the same structure that as shown in FIG. 5, and therefore the description is not repeated.

In the circuit diagram in FIG. 8, I/O lines IOA, /IOB, IOB, and /IOA are arranged in this order.

Figure 9:
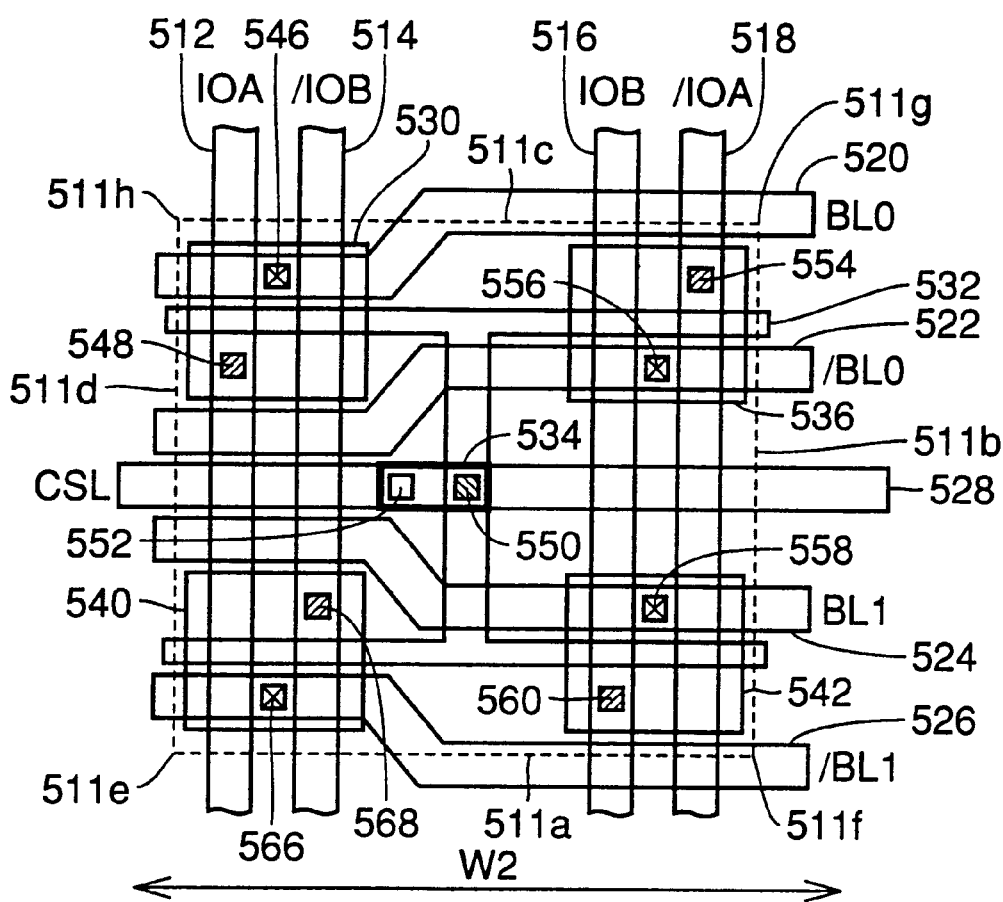
FIG. 9 is a schematic diagram showing the arrangement of connection portions between I/O lines and bit lines shown in FIG. 8.

FIG. 9 is a schematic diagram showing the arrangement of the connection portions between the I/O lines and bit lines shown in FIG. 8.

Referring to FIG. 9, the connection portions between the I/O lines and bit lines are formed inside a square 511 having sides 511a, 511b, 511c, and 511d.

The corners formed by sides 511a and 511b, sides 511b and 511c, sides 511c and 511d, and sides 511d and 511a correspond to corner portions 511f, 511g, 511h, and 511e, respectively.

Corner portions 511h, 511e, 511f and 511g are provided with transistors 530, 540, 542 and 530, respectively, and in the center of each of the transistors, there is provided a gate electrode 532 parallel to side 511a. Gate electrode 532 is for example composed of tungsten silicide. Gate electrode 532 is advantageous for reducing the area as compared to the case shown in FIG. 6, because the electrode is integrally formed in the same electrode layer for the four transistors.

Bit line BL0 is provided almost along side 511c, and bit line /BL1 is provided almost along side 511a. In the region between bit lines BL0 and /BLL1, /BL0 is provided adjacent to bit line BL0, and bit line BL1 is provided between bit lines /BL0 and /BL1. These bit lines are for example composed of tungsten silicide.

Bit line BL0 is electrically connected to a first impurity region in transistor 530 through a contact portion 546. Bit line /BL0 is electrically connected to a first impurity region in transistor 536 through a contact portion 556. Bit line BL1 is electrically connected to a first impurity region in transistor 542 through a contact portion 558. Bit line /BL1 is electrically connected to a first impurity region in transistor 540 through a contact portion 566.

I/O line IOA is provided along side 511d between sides 511d and 511b, and I/O line /IOA is provided along side 511b. I/O line /IOB parallel and adjacent to I/O line IOA is provided between I/O lines IOA and /IOA, and I/O line IOB parallel and adjacent to I/O line /IOB is provided between I/O lines /IOA and /IOB. These I/O lines are for example formed of a first aluminum layer.

I/O line IOA is electrically connected to a second impurity region in transistor 530 through a contact potion 548. I/O line /IOB is electrically connected to a second impurity region in transistor 540 through a contact portion 568. I/O line /IOA is connected to a second impurity region in transistor 536 through a contact portion 554. I/O line IOB is electrically connected to a second impurity region in transistor 542 through a contact portion 560.

An interconnection 534 is provided parallel to side 511a in the center of square 511, and interconnection 534 is electrically connected to gate electrode 532 through a contact portion 550.

Column selecting line CSL is provided parallel to side 511a in the middle between sides 511a and 511c. Column selecting line CSL is electrically connected to interconnection 534 through a contact portion 552. Interconnection 534 is for example formed of a first aluminum layer and column selecting line CSL is formed for example of a second aluminum layer.

In this arrangement, width W2 may be maintained at the same value as the case of the conventional device.

The operation of semiconductor device 1 according to the present invention in a test mode will be now briefly described.

Figure 10:
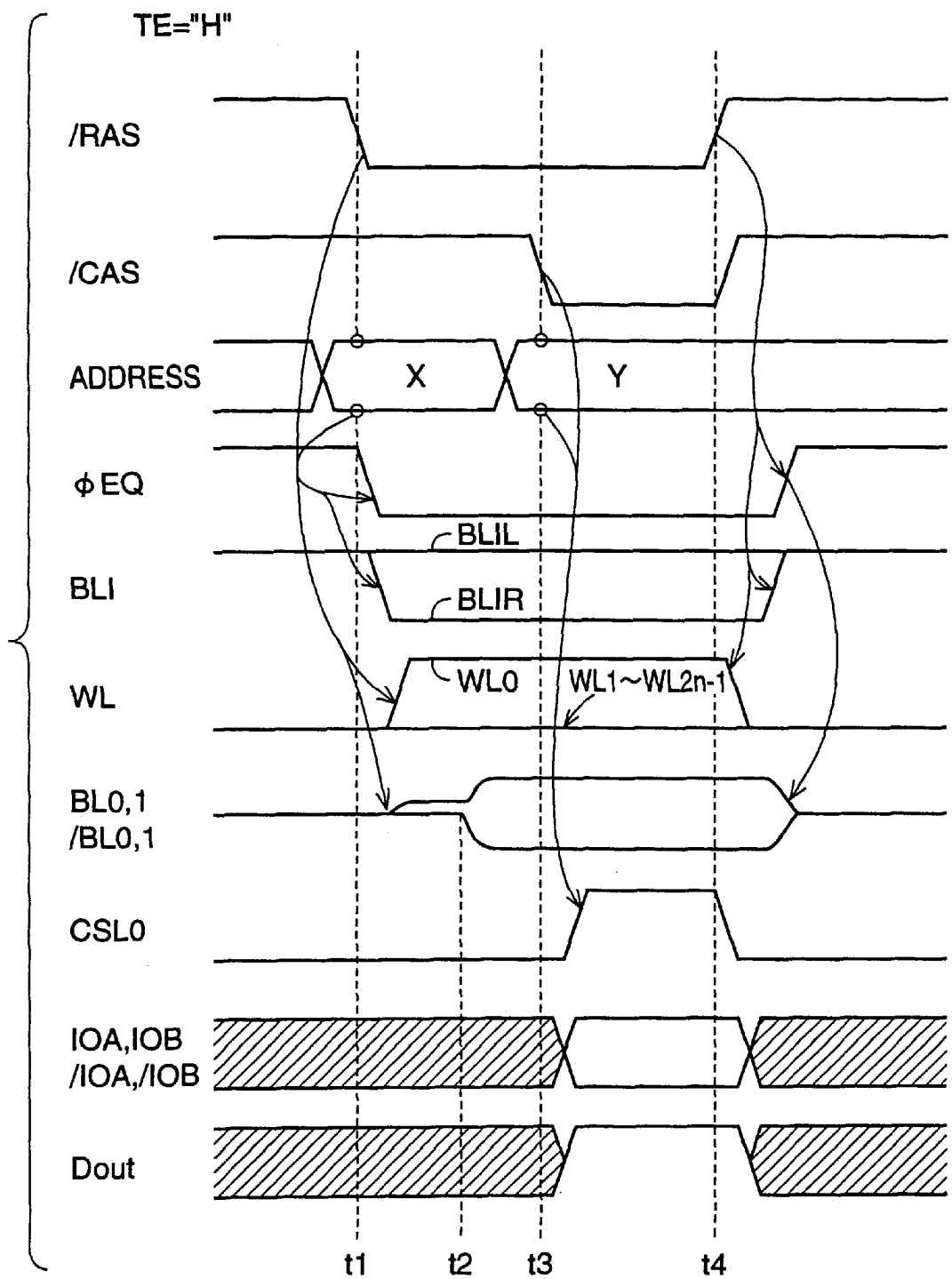
FIG. 10 is an operation waveform chart for use in illustration of the operation during reading in a test mode.

FIG. 10 is an operation waveform chart for use in illustration of the operation of the device during reading in the test mode.

Referring to FIGS. 8 and 10, a row address strobe signal /RAS falls at time t1. Accordingly, a row address (X address) input to an address terminal is taken as an internal row address. An equalize signal φEQ which activates equalizers 440 and 480 is inactivated, and bit lines BL0 and BL1, and bit lines /BL0 and /BL1 shown in FIG. 8 are isolated from each other. At the time, bit line isolation control signal BLIR is inactivated, while bit line isolation control signal BLIL maintains its activated state.

As a result, bit line isolation gates 442 and 444 isolate bit lines BLR0 and /BLR0 from bit lines BL0 and /BL0, respectively. Similarly, bit line isolation gates 482 and 484 isolate bit lines BLR1 and /BLR1 from bit lines BL1 and /BL1, respectively.

Bit lines BLL0 and BLL0 continue to be connected to bit lines BL0 and /BL0 by the function of bit line isolation gates 430 and 432. Similarly, bit lines BLL1 and /BLL1 continue to be connected to bit lines BL1 and /BL1 by the function of bit line isolation gates 470 and 472, respectively.

Then, the potential of word line WL0 corresponding to the taken row address is activated. The potentials of not-selected word lines WL1 to WL2n-1 are not activated. In response to the activation, charges stored in capacitors 224 and 264 are discharged onto bit lines BLL0 and BLL1 through access transistors 222 and 262, respectively. In FIG. 10, positive charges are stored in the capacitors, and therefore the potentials of bit lines BL0 and BL1 are slightly raised from the potential levels of bit lines /BL0 and /BL1, respectively.

Now, at time t2, in response to a falling of row address strobe signal /RAS, sense amplifiers 434 and 474 are activated to amplify the potential differences between bit lines BL0 and BL1 and bit lines /BL0 and /BL1.

At time t3, an externally applied column address strobe signal /CAS falls. A column address (Y address) input to the address terminal is taken accordingly. In response to this, column selecting line CSL0 is selected and has its potential activated. Then, bit lines BL0, /BL0, BL1, and /BL1 are electrically connected to I/O lines IOA, /IOA, IOB, and /IOB, respectively by activation of I/O line isolation gates 436, 438, 476, and 478, respectively. As a result, data read out on bit line is read out onto I/O lines.

In the test mode, by the function of differential amplifiers 80 and 78 and EXNOR circuit 82 shown in FIG. 2, an H level is output on output terminal Dout if data read out on I/O lines IOA and IOB are the same.

At time t4, as row address strobe signal /RAS rises, column address strobe signal /CAS rises. Then, the potential of word line WL1 is inactivated, followed by activation of bit line isolation control signal BLIR and equalize signal φEQ is activated. As a result, bit lines BL0, /BL0, BL1, and /BL1 are pulled to the intermediate potential. The potential of column selecting line CSL0 is inactivated, so that the I/O lines are isolated from the bit lines.

As described above, data in two memory cells may be tested for reading at the same time.

FIG. 11 is an operation waveform chart for use in illustration of the operation during writing in the test mode.

Referring to FIGS. 8 and 11, at time t1, externally applied row address strobe signal /RAS falls. Accordingly, a row address (X address) input to the address terminal is taken inside accordingly. Equalize signal φEQ which activates equalizers 440 and 480 is inactivated, and bit lines BL0 and BL1, and bit lines BL0 and /BL1 are isolated from each other.

At the time, bit line isolation control signal BLIR is inactivated, and bit lines BLR0 and /BLR0 are isolated from bit lines BL0 and /BL0 by bit line isolation gates 442 and 444, respectively. Similarly, bit lines BLR1 and /BLR1 are isolated from bit lines BL1 and /BL1 by bit line isolation gates 482 and 484, respectively.

Meanwhile, bit line isolation control signal BLIL maintains its activated state, and therefore bit lines BLL0 and /BLL0 continue to be connected to bit lines BL0 and /BL0 by the function of bit line isolation gates 430 and 432, respectively, and similarly bit lines BLL1 and /BLL1 continue to be connected to bit lines BL1 and /BL1 by the function of bit line isolation gates 470 and 472, respectively.

Then, the potential of word line WL0 corresponding to the row address is activated. Accordingly, capacitors 224 and 264 are connected to bit lines BLL0 and BLL1 by the function of access transistors 222 and 262. As a result, charges stored in capacitors 224 and 264 are discharged onto bit lines BLL0 and BLL1.

At time t2, the potential differences between bit lines BL0 and BL1 and bit lines /BL0 and /BL1, respectively are amplified by activation of sense amplifiers.

At time t3, externally applied column address strobe signal /CAS falls. Accordingly, data D1 externally applied to terminal Din is taken onto I/O lines IOA, /IOA, IOB, and /IOB.

Then, the potential of column selecting line CSL0 is activated, data D1 is applied to a bit line corresponding to the column selecting line, and bit lines BL0, /BL0, BL1, and /BL1 attain a potential corresponding to the externally applied data.

At time t4, when row address strobe signal /RAS and column address strobe signal /CAS rise, the potential of word line WL0 is inactivated, and a value corresponding to externally applied data D1 is maintained in capacitors 224 and 264. The potential of column selecting line CSL0 is inactivated, and the I/O lines and bit lines are isolated.

Then, bit line isolation control signal BL1 is entirely activated, and equalize signal φEQ is activated, so that all the bit lines attain the intermediate potential.

Thus, externally applied data D1 is written into two memory cells at a time.

Figure 12:
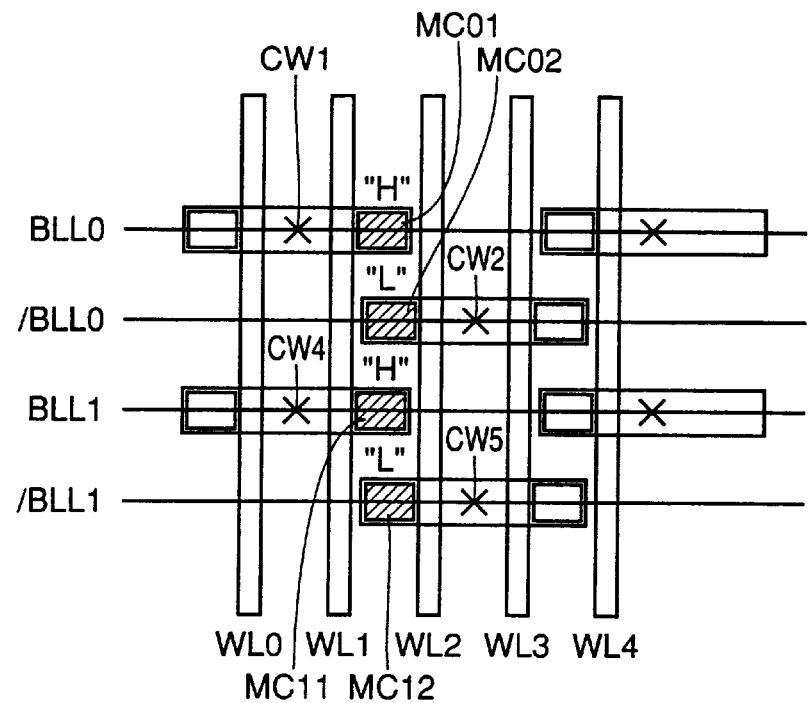
FIG. 12 is a schematic diagram for use in illustration of data written into memory cells and the arrangement of the memory cells.

FIG. 12 is a schematic diagram for use in illustration of the relation between data written into memory cells and the position of the memory cells.

Referring to FIG. 12, bit lines BLL0, /BLL0, BLL1, and /BLL1 are arranged parallel in this order, and word lines WL0, WL1, WL2, WL3, and WL4 are provided in a direction almost orthogonal to the bit lines in this order. Capacitors MC01, MC02, MC11 and MC12 are arranged in this order in the region between word lines WL1 and WL2.

Let us now assume that data externally applied to a data input terminal is at an H (high) level. If an input column address has a corresponding value, bit lines BLL0 and BLL1 attain an H potential level during a multi-bit test, and bit lines /BLL0 and /BLL1 attains an L potential level. If word line WL1 is in an activated state at the time, the potentials of bit lines BLL0 and BLL1 are applied to capacitors MC01 and MC1 as data through contact portions CW1 and CW4. If word line WL2 is in an activated state, the potentials of bit lines /BLL0 and /BLL1 are applied to capacitors MC02 and MC12 through contact portions CW2 and CW5, respectively. At the time, an L level potential in the opposite polarity to the input signal is written.

As a result, if H level data is serially externally applied, capacitors in adjacent memory cells are alternately written with an H level potential and an L level potential. More specifically, by a multi-bit test, a short circuit fault between adjacent memory cells may be detected as well.

In this case, as shown in FIG. 8, I/O lines IOA, /IOB, IOB, and /IOA are provided with H, L, H and L potentials, respectively. If there is a short circuit fault between adjacent I/O lines, an erroneous operation is caused because the potential of I/O lines cannot be normally maintained, and therefore such a fault can be also detected at the same time during the multi-bit test.

More specifically, in the semiconductor device according to the first embodiment, if two bits are written/read at a time in the test mode for testing at a high speed without increasing the chip area, a short circuit fault between memory cells and a short circuit fault between I/O lines may be simultaneously detected in a single test.

First Variation of First Embodiment

Figure 13:
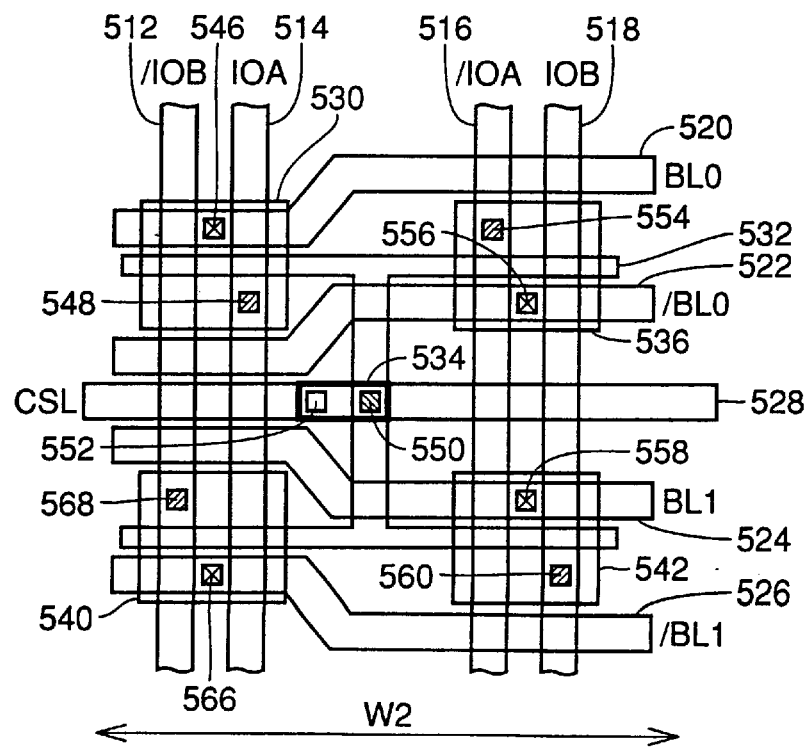
FIG. 13 is a schematic diagram showing the arrangement of connection portions between I/O lines and bit lines in a semiconductor device in a variation of the first embodiment.

FIG. 13 is a schematic diagram showing the arrangement of the connection portions between I/O lines and bit lines in a semiconductor device according to a first variation of the first embodiment of the invention.

Referring to FIG. 13, the semiconductor device according to the first variation is different from the semiconductor device according to the first embodiment in the order of arranging I/O lines. In FIG. 9, the I/O lines are arranged in the order of IOA, /IOB, IOB, and /IOA, while in FIG. 13, I/O lines are arranged in the order of /IOB, IOA, /IOA, and IOB. Accordingly, the positions of contact portions 548, 550, 554, and 560 in FIG. 9 are shifted onto corresponding I/O lines.

FIG. 13 is substantially identical to FIG. 9 in the other points, and therefore the description is not repeated.

By arranging the I/O lines as shown in FIG. 13, the same effects as the first embodiment may be brought about.

Second Variation of First Embodiment

Figure 14:
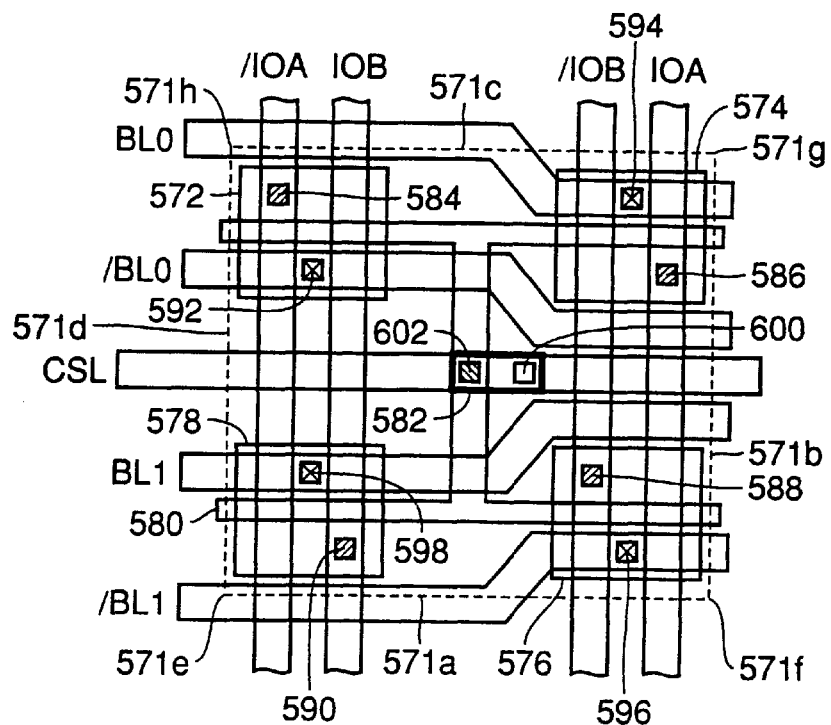
FIG. 14 is a schematic diagram showing the arrangement of a connection portion between I/O lines and bit lines in a semiconductor device in a second variation of the first embodiment.

FIG. 14 is a schematic diagram showing the arrangement of the connection portions between I/O lines and bit lines in a semiconductor device according to a second variation of the first embodiment of the invention.

Referring to FIG. 14, the connection portions between the I/O lines and bit lines are formed inside a square 571 having sides 571a, 571b, 571c, and 571d.

The corners formed by sides 571a and 571b, sides 571b and 571c, sides 571c and 571d, and sides 571d and 571a correspond to corner portions 571f, 571g, 571h, and 571e, respectively.

Corner portions 571h, 571e, 571f, and 571g are provided with transistors 572, 578, 576, and 574, respectively, and there is provided a gate electrode 580 parallel to side 571a in the center of each of the transistors. Gate electrode 580 is for example composed of tungsten silicide.

Bit line BL0 is provided almost along side 571c, and bit line /BL1 is provided almost along side 571a. In the region between bit lines BL0 and /BL1, bit line /BL0 is provided adjacent to bit line BL0, while between bit lines /BL0 and /BL1, bit line BL1 is provided. These bit lines are for example formed of tungsten silicide.

Bit line BL0 is electrically connected to a first impurity region in transistor 574 through a contact portion 594. Bit lines /BL0 is electrically connected to a first impurity region in transistor 572 through a contact portion 592. Bit line BL1 is electrically connected to a first impurity region in transistor 578 through a contact portion 598. Bit line /BL1 is electrically connected to a first impurity region in transistor 576 through a contact portion 596.

I/O line /IOB is provided along side 571d between sides 571d and 571b, and I/O line IOA is provided along side 571b. Between I/O lines IOA and /IOA, I/O line /IOB parallel and adjacent to I/O line IOA is provided, while between I/O lines /IOA and /IOB, I/O line IOB parallel to I/O line /IOB is provided. These I/O lines are for example formed of a first aluminum layer.

I/O line IOA is electrically connected to a second impurity region in transistor 574 through a contact portion 586. I/O line /IOB is electrically connected to a second impurity region in transistor 576 through a contact portion 588. I/O line /IOA is connected to a second impurity region in transistor 572 through a contact portion 584. I/O line IOB is electrically connected to a second impurity region in transistor 578 through a contact portion 590.

An interconnection 582 is provided in the center of square 571, and parallel to side 571*a*, and interconnection 582 is electrically connected to gate electrode 580 through a contact portion 602.

Column selecting line CSL is provided parallel to side 571*a* in the middle between sides 571*a* and 571*c*. Column selecting line CSL is electrically connected to interconnection 582 through a contact portion 600. Interconnection 582 is for example formed of the first aluminum layer, and column selecting line CSL is for example formed of a second aluminum layer.

In this arrangement, the width of the connection portions can be maintained at the same value as the case of the conventional device.

The arrangement of I/O lines shown in FIG. 14 can bring about the same effect as the first embodiment.

Third Variation of First Embodiment

Figure 15:
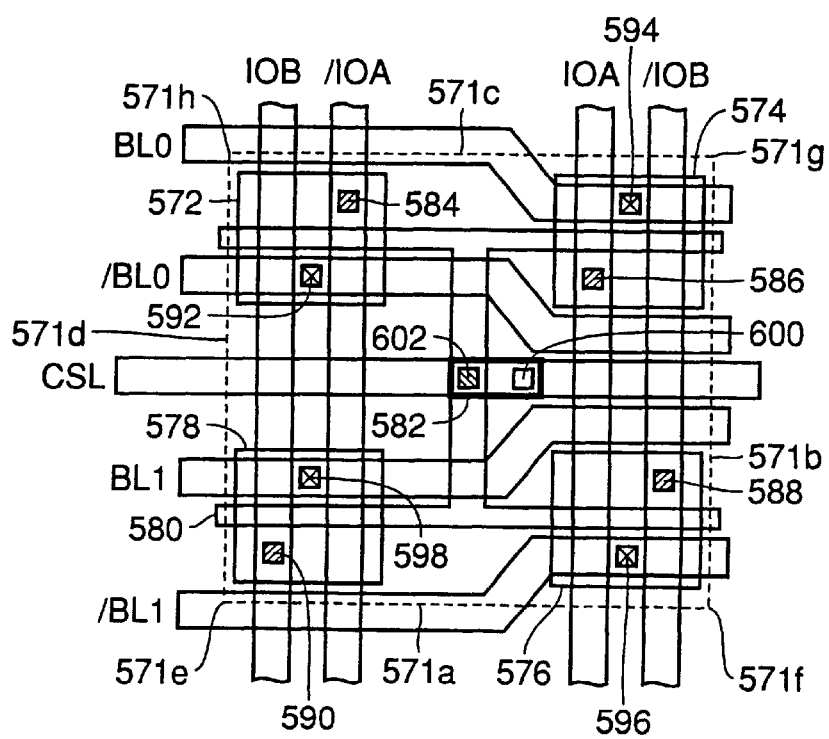
FIG. 15 is a schematic diagram showing the arrangement of connection portions between I/O lines and bit lines in a semiconductor device in a third variation of the first embodiment.
Figure 16:
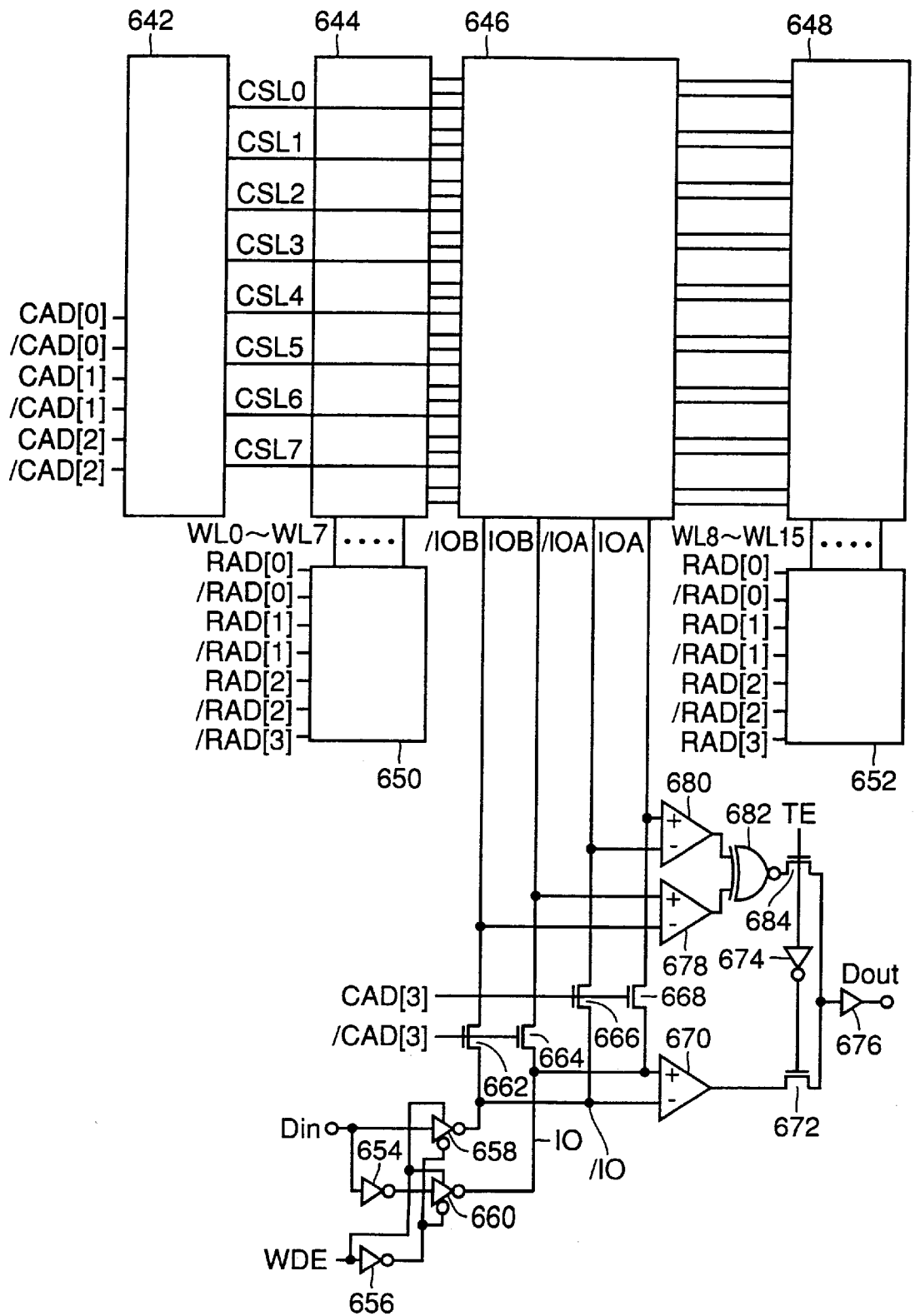
FIG. 16 is a schematic diagram showing the configuration of a main part of a conventional semiconductor memory device.
Figure 17:
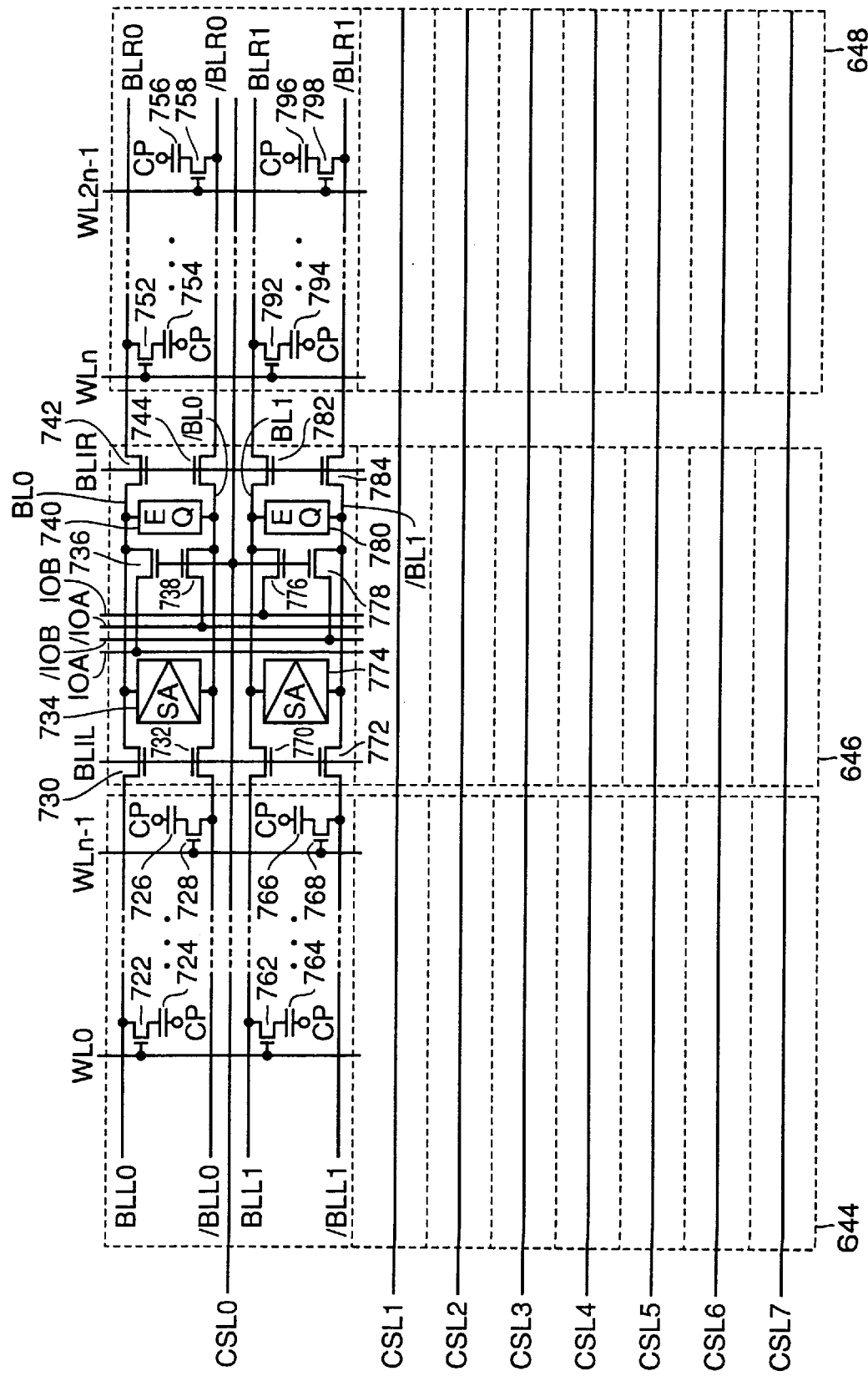
FIG. 17 is a circuit diagram of a conventional semiconductor memory device disclosed by U.S. Pat. No. 5,021,998.

FIG. 15 is a schematic diagram showing the arrangement of the connection portions between I/O lines and bit lines in a semiconductor device according to a third variation of the first embodiment of the invention.

Referring to FIG. 15, the semiconductor device according to the third variation of the first embodiment is different from the semiconductor device according to the second variation in the order of arranging the I/O lines. In FIG. 14, the I/O lines arranged in the order of /IOA, /IOB, /IOB and IOA, while in FIG. 15 the I/O lines arranged in the order of IOB, /IOA, IOA, and /IOB. Accordingly, contact portions 584, 590, 586, and 588 in FIG. 14 are shifted onto corresponding I/O lines.

FIG. 15 has the same structure as FIG. 14 in the other portions, and therefore the description is not repeated.

By arranging the I/O lines as shown in FIG. 15, the same effect as the first embodiment may be brought about.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a main surface of a semiconductor substrate, comprising:

a first memory cell for storing first data that takes one of first and second logical values;

a word line for selecting said first memory cell;

a first bit line pair for transmitting said first data to said first memory cell;

a first bus line pair for transmitting said first data to said first bit line pair, said first bus line pair including:

a first bus line to attain a first potential when said first data takes said first logical value, and a second potential lower than said first potential when said first data takes said second logical value, and a first complementary bus line to attain a potential complementary to said first bus line in response to said first data;

a second memory cell selected in response to an activation of said word line for storing second data that takes one of said first and second logical values;

a second bit line pair for transmitting said second data to said second memory cell;

a second bus line pair for transmitting said second data to said second bit line pair, said second bus line pair including, a second bus line to attain said first potential when said second data takes said first logical value, and said second potential when said second data takes said second logical value, and a second complementary bus line to attain a potential complementary to said second bus line in response to said second data, at least a part of said second bus line intersecting said first and second bit line pairs lying between said first and second complementary bus lines on said semiconductor main surface;

one data terminal; and test control means for controlling a test operation to read/write data from/to said first memory cell and said second memory cell through said data terminal in response to an externally applied instruction, said test control means transmitting data externally applied to said data terminal to one of said first and second bus line pairs in a normal operation and to both said first and second bus line pairs in a test operation.

2. The semiconductor memory device as recited in claim 1, wherein said test control means includes match detection means for detecting match/mismatch between data read out from said first and second memory cells through said first and second bus line pairs in said test operation and outputting a detected result.

3. The semiconductor memory device as recited in claim 1, wherein said first and second bus lines and said first and second complementary bus lines are at least partly arranged on said semiconductor main surface in the order of said first bus line, said second complementary bus line, said second bus line, and said first complementary bus line.

4. The semiconductor memory device as recited in claim 1, wherein said first and second bus lines, and said first and second complementary bus lines are arranged at least partly on said semiconductor main surface in the order of said second bus line, said first complementary bus line, said first bus line, and said second complementary bus line.

5. A semiconductor memory device formed on a main surface of a semiconductor substrate, comprising:

a first memory cell for storing first data that takes one of first and second logical values;

a first bit line pair for transmitting said first data to said first memory cell, said first bit line pair including, a first bit line to attain a first potential when said first data takes said first logical value, and a second potential lower than said first potential when said first data takes said second logical value, and a first complementary bit line to attain a potential complementary to said first bit line in response to said first data;

a first bus line pair for transmitting said first data to said first bit line pair, said first bus line pair including, a first bus line to attain said first potential when said first data takes said first logical value, and said second potential lower than said first potential when said first data takes said second logical value, and a first complementary bus line to attain a potential complementary to said first bus line in response to said first data;

a second memory cell for storing second data that takes one of said first and second logical values;

a second bit line pair for transmitting said second data to said second memory cell, said second bit line pair including, a second bit line to attain said first potential when said second data takes said first logical value and said second potential when said second data takes said second logical value, and a second complementary bit line to attain a potential complementary to said second bit line in response to said second data, said first and second bit lines, and said first and second complementary bit lines being arranged on said semiconductor main surface in the order of said first bit line, said first complementary bit line, said second bit line, and said second complementary bit line;

a second bus line pair for transmitting said second data to said second bit line pair, said second bus line pair including, a second bus line to attain said first potential when said second data takes said first logical value, and said second potential when said second data takes said second logical value, and a second complementary bus line to attain a potential complementary to said second bus line in response to said second data, at least a part of said second bus line lying between said first and second complementary bus lines on said semiconductor main surface, said first and second bus lines and said first and second complementary bus lines being at least partly arranged on said semiconductor main surface in the order of said first bus line, said second complementary bus line, said second bus line, and said first complementary bus line;

a first transistor, provided in a region of said semiconductor main surface under said first bus line, said second complementary bus line and said first bit line, for connecting said first bus line and said first bit line;

a second transistor, provided in a region of said semiconductor main surface under said second bus line, said first complementary bus line and said first complementary bit line, for connecting said first complementary bus line and said first complementary bit line;

a third transistor, provided in a region of said semiconductor main surface under said second bus line, said first complementary bus line and said second bit line, for connecting said second bus line and said second bit line; and a fourth transistor, provided in a region of said semiconductor main surface under said first bus line, said second complementary bus line and said second complementary bit line, for connecting said second complementary bus line and said second complementary bit line.

6. The semiconductor memory device as recited in claim 5, wherein said first, second, third and fourth transistors are MOS transistors, and the gate electrodes of said first, second, third and fourth transistors are formed by the same gate electrode layer.

7. A semiconductor memory device formed on a main surface of a semiconductor substrate, comprising:

a first memory cell for storing first data that takes one of first and second logical values;

a first bit line pair for transmitting said first data to said first memory cell, said first bit line pair including, a first bit line to attain a first potential when said first data takes said first logical value, and a second potential lower than said first potential when said first data takes said second logical value, and a first complementary bit line to attain a potential complementary to said first bit line in response to said first data;

a first bus line pair for transmitting said first data to said first bit line pair, said first bus line pair including, a first bus line to attain said first potential when said first data takes said first logical value, and said second potential lower than said first potential when said first data takes said second logical value, and a first complementary bus line to attain a potential complementary to said first bus line in response to said first data;

a second memory cell for storing second data that takes one of said first and second logical values;

a second bit line pair for transmitting said second data to said second memory cell, said second bit line pair including, a second bit line to attain said first potential when said second data takes said first logical value, and said second potential when said second data takes said second logical value, and a second complementary bit line to attain a potential complementary to said second bit line in response to said second data, said first and second bit lines, and said first and second complementary bit lines being arranged on said semiconductor main surface in the order of said first bit line, said first complementary bit line, said second bit line, and said second complementary bit line;

a second bus line pair for transmitting said second data to said second bit line pair, said second bus line pair including, a second bus line to attain said first potential when said second data takes said first logical value, and said second potential when said second data takes said second logical value, and a second complementary bus line to attain a potential complementary to said second bus line in response to said second data, at least a part of said second bus line lying between said first and second complementary bus lines on said semiconductor main surface, said first and second bus lines and said first and second complementary bus lines being at least partly arranged on said semiconductor main surface in the order of said second bus line, said first complementary bus line said first bus line, and said second complementary bus line;

a first transistor, provided in a region of said semiconductor main surface under said first bus line, said second complementary bus line and said first bit line, for connecting said first bus line and said first bit line;

a second transistor, provided in a region of said semiconductor main surface under said second bus line, said first complementary bus line and said first complementary bit line, for connecting said first complementary bus line and said first complementary bit line;

a third transistor, provided in a region of said semiconductor main surface under said second bus line, said first complementary bus line and said second bit line, for connecting said second bus line and said second bit line; and a fourth transistor, provided in a region of said semiconductor main surface under said first bus line, said second complementary bus line and said second complementary bit line, for connecting said second complementary bus line and said second complementary bit line.

8. The semiconductor memory device as recited in claim 7, wherein said first, second, third and fourth transistors are MOS transistors, and the gate electrodes of said first, second, third and fourth transistors are formed by the same gate electrode layer.

9. A semiconductor memory device comprising:

first and second memory cells;

a word line connected to said first and second memory cells;

a first bit line pair including a first bit line connected to said first memory cell, and a first complementary bit line;

a second bit line pair including a second bit line connected to said second memory cell, and a second complementary bit line;

first and second data bus line pairs coupled to said first and second bit line pairs respectively, said first data bus line pair including (i) a first data bus line coupled to said first bit line and (ii) a first complementary data bus line coupled to said first complementary bit line, said second data bus line pair including (i) a second data bus line coupled to said second bit line and (ii) a second complementary data bus line coupled to said second complementary bit line, said first complementary data bus line being disposed between said first and second data bus lines, and adjacent thereto; and a multibit test circuit for producing a test result indicating whether read data transmitted by said first and second data bus line pairs match each other.

10. The semiconductor memory device according to claim 9, wherein said second data bus line is disposed between said first and second complementary data bus lines, and adjacent thereto.

11. The semiconductor memory device according to claim 9, wherein said first data bus line is disposed between said first and second complementary data bus lines, and adjacent thereto.

* * * * *